US012501612B2

(12) United States Patent
Kim et al.

(10) Patent No.: US 12,501,612 B2
(45) Date of Patent: Dec. 16, 2025

(54) SEMICONDUCTOR DEVICE AND ELECTRONIC SYSTEM INCLUDING THE SAME

(71) Applicant: Samsung Electronics Co., Ltd., Suwon-si (KR)

(72) Inventors: Choasub Kim, Hwaseong-si (KR); Bongtae Park, Seoul (KR); Jae-Joo Shim, Suwon-si (KR); Sungil Cho, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 607 days.

(21) Appl. No.: 17/668,824

(22) Filed: Feb. 10, 2022

(65) Prior Publication Data

US 2022/0293622 A1 Sep. 15, 2022

(30) Foreign Application Priority Data

Mar. 10, 2021 (KR) ........................ 10-2021-0031480

(51) Int. Cl.
*H01L 23/535* (2006.01)
*H10B 41/10* (2023.01)
(Continued)

(52) U.S. Cl.
CPC ........... *H10B 43/10* (2023.02); *H01L 23/535* (2013.01); *H10B 41/10* (2023.02); *H10B 41/27* (2023.02);
(Continued)

(58) Field of Classification Search
CPC ........ H10B 43/10; H10B 41/10; H10B 41/27; H10B 41/41; H10B 43/27; H10B 43/40;
(Continued)

(56) References Cited

U.S. PATENT DOCUMENTS 9,177,613 B2 11/2015 Lee et al.
9,786,673 B1 10/2017 Cho et al.
(Continued)

FOREIGN PATENT DOCUMENTS

KR 10-2019-0133362 A 12/2019
KR 10-2020-0103943 A 9/2020

OTHER PUBLICATIONS

Korean Office Action dated Mar. 17, 2025 issued in Korean Patent Application No. 10-2021-0031480.

*Primary Examiner* — Eugene Lee
(74) *Attorney, Agent, or Firm* — Harness, Dickey & Pierce, P.L.C.

(57) ABSTRACT

A semiconductor device may include a first cell block including a first electrode structure including first electrodes stacked on a substrate, and first channels penetrating the first electrode structure, and a second cell block including a second electrode structure including second electrodes stacked on the substrate, and second channels penetrating the second electrode structure. The first and second electrode structures may extend in a first direction. The first electrode structure may have a first width in a second direction, and the second electrode structure may have a second width greater than the first width. A side surface of the first electrode structure and the first channel adjacent thereto may be apart from each other by a first distance, and a side surface of the second electrode structure and the second channel adjacent thereto may be apart from each other by a second distance different from the first distance.

20 Claims, 23 Drawing Sheets

(51) Int. Cl.
  *H10B 41/27* (2023.01)
  *H10B 41/41* (2023.01)
  *H10B 43/10* (2023.01)
  *H10B 43/27* (2023.01)
  *H10B 43/40* (2023.01)
(52) U.S. Cl.
  CPC ............. *H10B 41/41* (2023.02); *H10B 43/27* (2023.02); *H10B 43/40* (2023.02)
(58) Field of Classification Search
  CPC ........ H10B 41/40; H10B 43/20; H10B 43/35; H10B 43/50; H01L 23/535; H01L 25/0652
  See application file for complete search history.

(56) References Cited

U.S. PATENT DOCUMENTS

| | | | |
|---|---|---|---|
| 9,786,676 B2 | 10/2017 | Yun et al. | |
| 9,812,462 B1 * | 11/2017 | Pang | ...................... H10B 43/10 |
| 9,917,100 B2 | 3/2018 | Zhang et al. | |
| 10,559,585 B2 * | 2/2020 | Kim | ...................... H01L 23/5226 |
| 10,644,026 B2 | 5/2020 | Lee et al. | |
| 10,658,381 B1 | 5/2020 | Yu et al. | |
| 12,082,404 B2 * | 9/2024 | Ku | ........................ H10B 41/10 |
| 2015/0145014 A1 | 5/2015 | Shin et al. | |
| 2016/0276264 A1 * | 9/2016 | Noda | ...................... H10B 43/27 |
| 2017/0033119 A1 | 2/2017 | Park et al. | |
| 2019/0043830 A1 * | 2/2019 | Sakakibara | ............ H10B 43/27 |
| 2019/0043881 A1 * | 2/2019 | Kim | ...................... H01L 29/6681 |
| 2019/0393243 A1 | 12/2019 | Kim et al. | |
| 2020/0075616 A1 * | 3/2020 | Hashimoto | ............ H10B 43/10 |
| 2020/0083239 A1 * | 3/2020 | Komiya | ................ H10B 43/27 |
| 2020/0119031 A1 * | 4/2020 | Shen | ...................... H10B 41/35 |
| 2020/0185402 A1 | 6/2020 | Son et al. | |
| 2021/0091044 A1 * | 3/2021 | Yamashita | ............. H10B 43/27 |
| 2021/0225871 A1 * | 7/2021 | Lee | ........................ H10B 41/10 |
| 2022/0077177 A1 * | 3/2022 | Ullah | .................... H10B 43/10 |
| 2023/0413549 A1 * | 12/2023 | Tsuchiya | ............... H10B 43/27 |

* cited by examiner

SEMICONDUCTOR DEVICE AND ELECTRONIC SYSTEM INCLUDING THE SAME

CROSS-REFERENCE TO RELATED APPLICATIONS

This U.S. non-provisional patent application claims priority under 35 U.S.C. § 119 to Korean Patent Application No. 10-2021-0031480, filed on Mar. 10, 2021, in the Korean Intellectual Property Office, the entire contents of which are hereby incorporated by reference.

BACKGROUND

Some example embodiments relate to a semiconductor device and/or an electronic system including the same.

A semiconductor device capable of storing a large capacity of data is used/required as a part of an electronic system. Accordingly, many studies are being conducted to increase the data storage capacity of the semiconductor device. For example, semiconductor devices, in which memory cells are three-dimensionally arranged, are being suggested.

SUMMARY

Some example embodiments of inventive concepts provide a semiconductor device with improved reliability and/or an increased integration density.

Alternatively or additionally, some example embodiments of inventive concepts provide an electronic system including a semiconductor device.

According to some example embodiments of inventive concepts, a semiconductor device may include a substrate, a first cell block including a first electrode structure and first channels penetrating the first electrode structure, the first electrode structure including first electrodes stacked on the substrate, and a second cell block including a second electrode structure and second channels penetrating the second electrode structure, the second cell block including second electrodes stacked on the substrate. The first and second electrode structures extend in a first direction, the first electrode structure has a first width in a second direction crossing the first direction, the second electrode structure has a second width greater than the first width, a side surface of the first electrode structure and the first channel adjacent to the first electrode structure are apart from each other by a first distance, and a side surface of the second electrode structure and the second channel adjacent to the second electrode structure are apart from each other by a second distance that is different from the first distance.

According to some example embodiments of inventive concepts, a semiconductor device may include a first cell block including a first electrode structure and first channels penetrating the first electrode structure, the first electrode structure including first electrodes stacked on a substrate, and a second cell block including a second electrode structure and second channels penetrating the second electrode structure, the second electrode structure including second electrodes stacked on the substrate. The first and second electrode structures extend in a first direction, the first channels correspond to a plurality of first columns apart from each other in a second direction crossing the first direction, the first columns comprise a first edge column closest to a side surface of the first electrode structure, and a first intermediate column next closest to the side surface of the first electrode structure, the second channels correspond to a plurality of second columns apart from each other in the second direction, the second columns comprise a second edge column closest to a side surface of the second electrode structure, and a second intermediate column next closest to the side surface of the second electrode structure, a distance between the second edge column and the second intermediate column is different from a distance between the first edge column and the first intermediate column, and a width of the first channels in the first edge column is different from a width of the second channels in the second edge column.

According to some example embodiments of inventive concepts, a semiconductor device may include a first cell block including a first electrode structure and first channels penetrating the first electrode structure, the first electrode structure including first electrodes stacked on a substrate, and a second cell block including a second electrode structure and second channels penetrating the second electrode structure, the second electrode structure including second electrodes stacked on the substrate. The first and second electrode structures extend in a first direction, in a second direction crossing the first direction, the first electrode structure has a first width and the second electrode structure has a second width greater than the first width, and the second channels of the second cell block differs from the first channels in at least one of a channel width or a first distance to another adjacent channel.

According to some example embodiments of inventive concepts, an electronic system may include a semiconductor device including a first cell block, a second cell block, a peripheral circuit connected to the first and second cell blocks, and an input/output pad electrically connected to the peripheral circuit, the first cell block comprising a first electrode structure and first channels penetrating the first electrode structure, the first cell block including first electrodes stacked on a substrate, the second cell block comprising a second electrode structure and second channels penetrating the second electrode structure, the second block including second electrodes stacked on the substrate, and a controller electrically connected to the semiconductor device through the input/output pad and configured to control the semiconductor device. The first and second electrode structures extend in a first direction, in a second direction crossing the first direction, the first electrode structure has a first width and the second electrode structure has a second width greater than the first width, and the second channels of the second cell block differs from the first channels in at least one of a channel width or a distance to another adjacent channel.

DETAILED DESCRIPTION

Some example embodiments of inventive concepts will now be described more fully with reference to the accompanying drawings, in which some example embodiments are shown.

Figure 1:
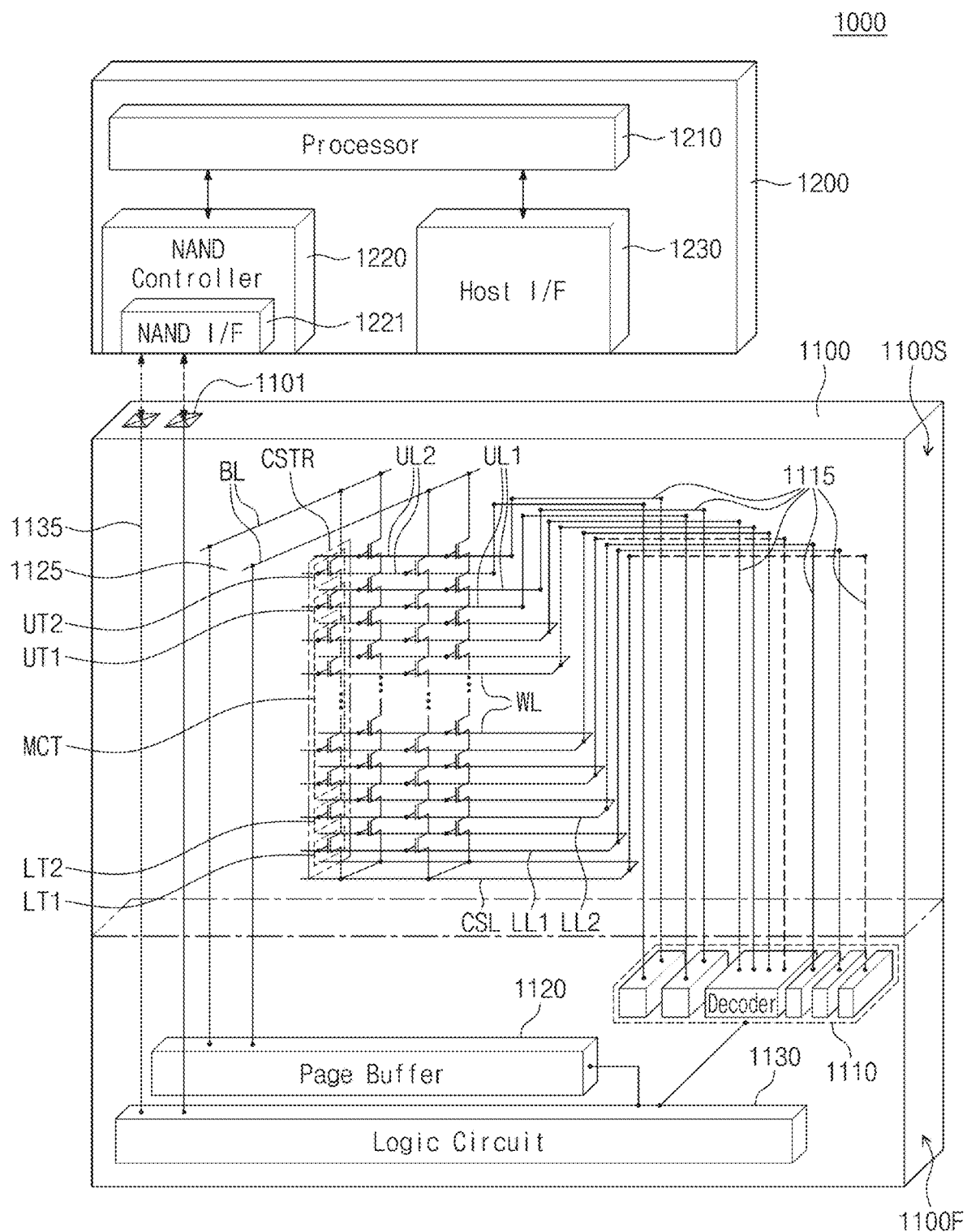
FIG. 1 is a diagram schematically illustrating an electronic system including a semiconductor device according to some example embodiments of inventive concepts.

FIG. 1 is a diagram schematically illustrating an electronic system including a semiconductor device according to some example embodiments of inventive concepts.

Referring to FIG. 1, an electronic system 1000 according to some example embodiments of inventive concepts may include a semiconductor device 1100 and a controller 1200, which are electrically connected to each other. The electronic system 1000 may be or may include a storage device including one or more semiconductor devices 1100 and/or an electronic device including the storage device. For example, the electronic system 1000 may be or may include at least one of a solid state drive (SSD) device, a universal serial bus (USB), a computing system, a medical system, or a communication system, in which at least one semiconductor device 1100 is provided.

The semiconductor device 1100 may be or may include a nonvolatile memory device (e.g., a NAND FLASH memory device). The semiconductor device 1100 may include a first structure 1100F and a second structure 1100S on the first structure 1100F. In some example embodiments, the first structure 1100F may be disposed beside the second structure 1100S.

The first structure 1100F may be or may include or correspond to a peripheral circuit structure, which includes a decoder circuit 1110, a page buffer 1120, and a logic circuit 1130. The second structure 1100S may be or may include a memory cell structure, which includes a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously changed, according to various example embodiments.

In some example embodiments, the upper transistors UT1 and UT2 may include at least one string selection transistor, and the lower transistors LT1 and LT2 may include at least one ground selection transistor. The gate lower lines LL1 and LL2 may be respectively used as gate electrodes of the lower transistors LT1 and LT2. The word lines WL may be respectively used as gate electrodes of the memory cell transistors MCT, and the gate upper lines UL1 and UL2 may be respectively used as gate electrodes of the upper transistors UT1 and UT2.

In some example embodiments, the lower transistors LT1 and LT2 may include a lower erase control transistor LT1 and a ground selection transistor LT2, which are connected in series. The upper transistors UT1 and UT2 may include a string selection transistor UT1 and an upper erase control transistor UT2, which are connected in series. At least one of the lower and upper erase control transistors LT1 and UT2 may be used to perform an erase operation, in which a gate-induced drain leakage (GIDL) phenomenon is used to erase/zero-out data stored in the memory cell transistors MCT.

The common source line CSL, the first and second gate lower lines LL1 and LL2, the word lines WL, and the first and second gate upper lines UL1 and UL2 may be electrically connected to the decoder circuit 1110 through first connection lines 1115, which are extended from the first structure 1100F into the second structure 1100S. The bit lines BL may be electrically connected to the page buffer 1120 through second connection lines 1125, which are extended from the first structure 1100F into the second structure 1100S.

In the first structure 1100F, the decoder circuit 1110 and the page buffer 1120 may be configured to control a control operation, which is performed on at least one of the memory cell transistors MCT by a selection memory cell transistor. The decoder circuit 1110 and the page buffer 1120 may be controlled by the logic circuit 1130. The semiconductor device 1100 may communicate with the controller 1200 through an input/output pad 1101, which is electrically connected to the logic circuit 1130. The input/output pad 1101 may be electrically connected to the logic circuit 1130 through an input/output connection line 1135, which is provided in the first structure 1100F and is extended into the second structure 1100S.

Although not shown, the first structure 1100F may include a voltage generator (not shown). The voltage generator may generate at least one of a program voltage, a read voltage, a pass voltage, a verification voltage, and so forth, which are used or needed to operate the memory cell strings CSTR. Here, the program voltage may be a relatively high voltage (e.g., 20V to 40V), compared with any of the read voltage, the pass voltage, and the verification voltage.

In some example embodiments, the first structure 1100F may include high-voltage transistors (e.g. transistors having a high threshold voltage) and low-voltage transistors (e.g. transistors having a lower threshold voltage). The decoder circuit 1110 may include pass transistors which are connected to the word lines WL of the memory cell strings CSTR. The pass transistors may include high-voltage transistors which can stand or operate under a high voltage (e.g., the program voltage) applied to the word lines WL during a programming operation). The page buffer 1120 may also high-voltage transistors which can stand the high voltage.

The controller 1200 may include a processor 1210, a NAND controller 1220, and a host interface 1230. In some example embodiments, the electronic system 1000 may include a plurality of semiconductor devices 1100, and in this case, the controller 1200 may control the semiconductor devices 1100.

The processor 1210 may control overall operations the electronic system 1000 including the controller 1200. The processor 1210 may be operated based on a specific firmware and/or software and/or hardware and may control the NAND controller 1220 to access the semiconductor device 1100. The NAND controller 1220 may include a NAND interface 1221, which is used to communicate with the semiconductor device 1100. The NAND interface 1221 may be used to transmit and receive control commands to control the semiconductor device 1100, and/or data to be written in or read from the memory cell transistors MCT of the semiconductor device 1100, and/or so forth. The host interface 1230 may be configured to allow for communication between the electronic system 1000 and an external host. When a control command is received from an external host through the host interface 1230, the processor 1210 may be control the semiconductor device 1100 in response to the control command.

Figure 2:
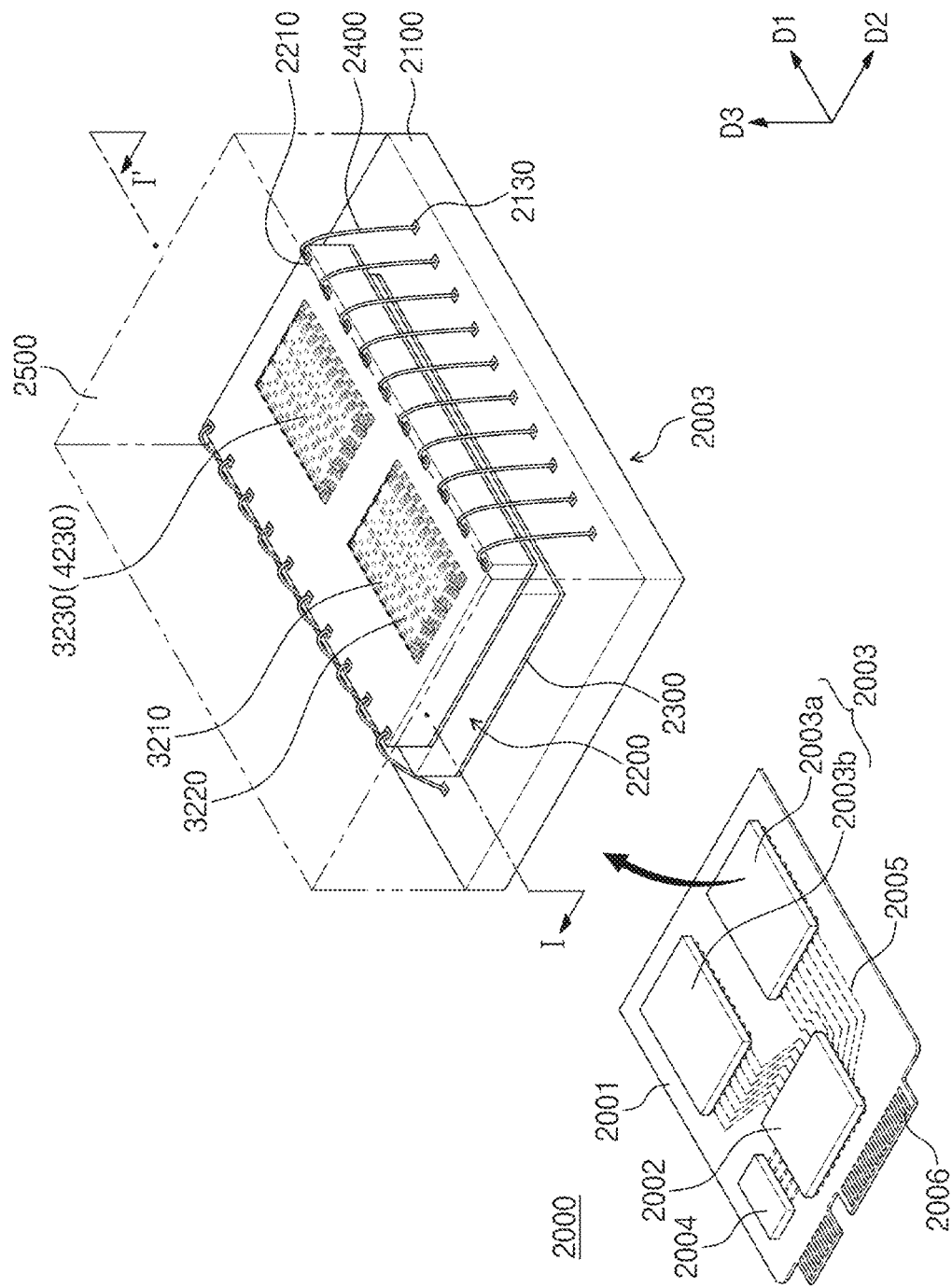
FIG. 2 is a perspective view schematically illustrating an electronic system including a semiconductor device according to some example embodiments of inventive concepts.

FIG. 2 is a perspective view schematically illustrating an electronic system including a semiconductor device according to some example embodiments of inventive concepts.

Referring to FIG. 2, an electronic system 2000 according to some example embodiments of inventive concepts may include a main board 2001 and a controller 2002, at least one semiconductor package 2003, and a DRAM 2004, which are mounted on the main board 2001. The semiconductor package 2003 and the DRAM 2004 may be connected to the controller 2002 and to each other by interconnection patterns 2005, which are formed in the main board 2001.

The main board 2001 may include a connector 2006, which includes a plurality of pins coupled to an external host. In the connector 2006, the number and/or the arrangement of the pins may depend on a communication interface between the electronic system 2000 and the external host. In some example embodiments, the electronic system 2000 may communicate with the external host, in accordance with one of interfaces, such as universal serial bus (USB), peripheral component interconnect express (PCI-Express), serial advanced technology attachment (SATA), universal flash storage (UFS) M-Phy, or the like. In some example embodiments, the electronic system 2000 may be driven by a power, which is supplied from the external host through the connector 2006. The electronic system 2000 may further include a Power Management Integrated Circuit (PMIC) distributing a power (not illustrated), which is supplied from the external host, to the controller 2002 and the semiconductor package 2003.

The controller 2002 may be configured to control a writing or reading operation on the semiconductor package 2003 and to improve an operation speed of the electronic system 2000.

The DRAM 2004 may be or may include a buffer memory, which relieves or helps to relieve technical difficulties caused by a difference in speed between the semiconductor package 2003, which serves as a data storage device, and an external host. In some example embodiments, the DRAM 2004 in the electronic system 2000 may serve as a cache memory and may provide a storage space to temporarily store data during a control operation on the semiconductor package 2003. In a case where the electronic system 2000 includes the DRAM 2004, the controller 2002 may further include a DRAM controller to control the DRAM 2004, in addition to a NAND controller to controlling the semiconductor package 2003; alternatively there may be one controller to control the DRAM 2004 and the semiconductor package 2003.

The semiconductor package 2003 may include first and second semiconductor packages 2003a and 2003b, which are spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the semiconductor chips 2200 on the package substrate 2100, adhesive layers 2300 disposed on respective bottom surfaces of the semiconductor chips 2200, a connection structure 2400 electrically connecting the semiconductor chips 2200 to the package substrate 2100, and a molding layer 2500 disposed on the package substrate 2100 to cover the semiconductor chips 2200 and the connection structure 2400.

The package substrate 2100 may be or may include a printed circuit board including package upper pads 2130. Each of the semiconductor chips 2200 may include an input/output pad 2210. The input/output pad 2210 may correspond to the input/output pad 1101 of FIG. 1. Each of the semiconductor chips 2200 may include gate stacks 3210 and vertical structures 3220. Each of the semiconductor chips 2200 may include a semiconductor device, which will be described below, according to some example embodiments of inventive concepts.

In some example embodiments, the connection structure 2400 may be a bonding wire electrically connecting the input/output pad 2210 to the package upper pads 2130. Thus, in each of the first and second semiconductor packages 2003a and 2003b, the semiconductor chips 2200 may be electrically connected to each other in a bonding wire manner and may be electrically connected to the package upper pads 2130 of the package substrate 2100. Alternatively or additionally in some example embodiments, the semiconductor chips 2200 in each of the first and second semiconductor packages 2003a and 2003b may be electrically connected to each other by a connection structure including through silicon vias (TSVs), not by the connection structure 2400 provided in the form of bonding wires.

In some example embodiments, the controller 2002 and the semiconductor chips 2200 may be included in a single package. In some example embodiments, the controller 2002 and the semiconductor chips 2200 may be mounted on a separate interposer substrate, which is prepared regardless of the main board 2001, and may be connected to each other through interconnection lines, which are provided in the interposer substrate.

Figure 3:
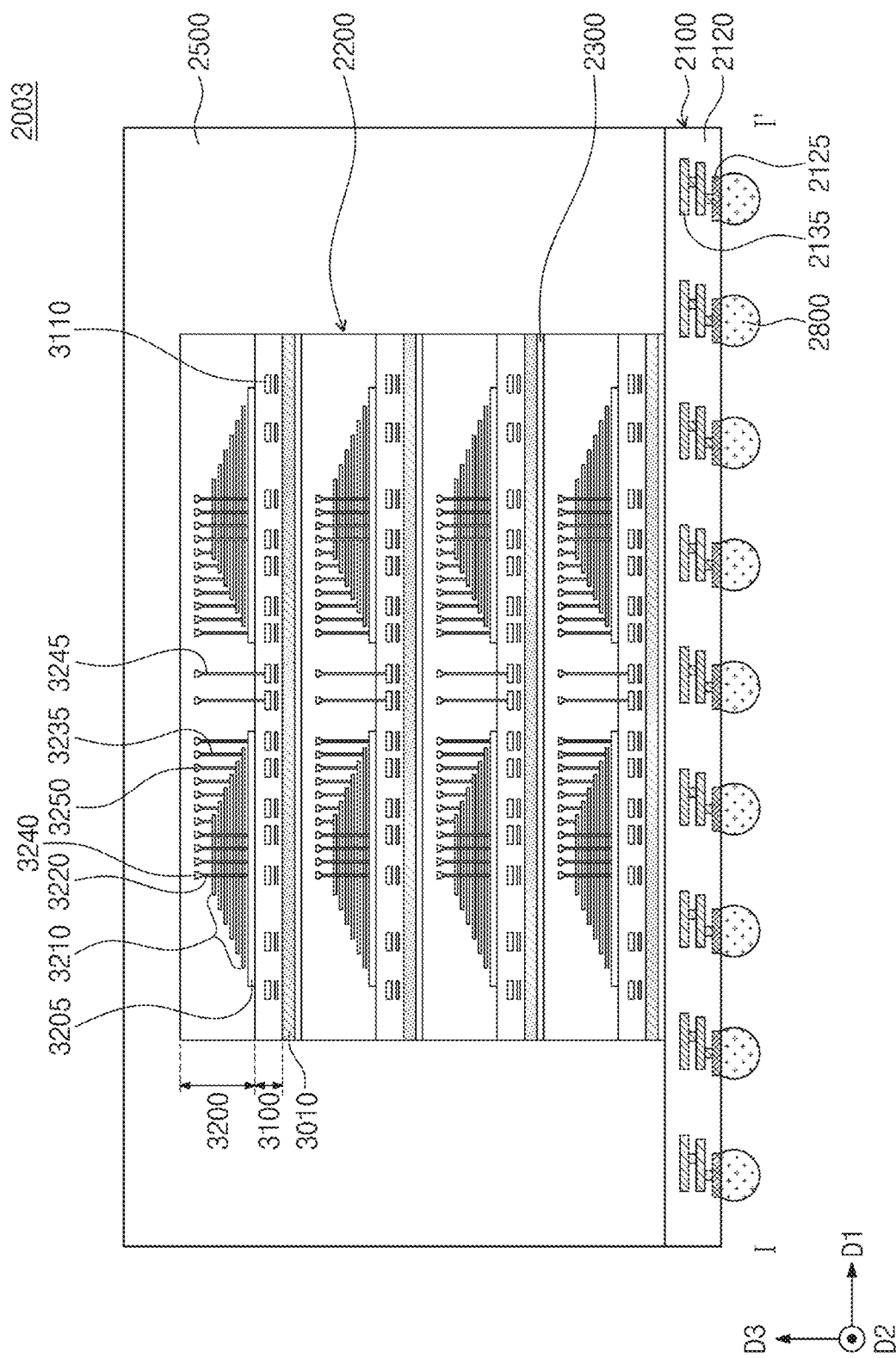
FIGS. 3 and 4 are sectional views schematically illustrating semiconductor packages according to some example embodiments of inventive concepts.
Figure 4:
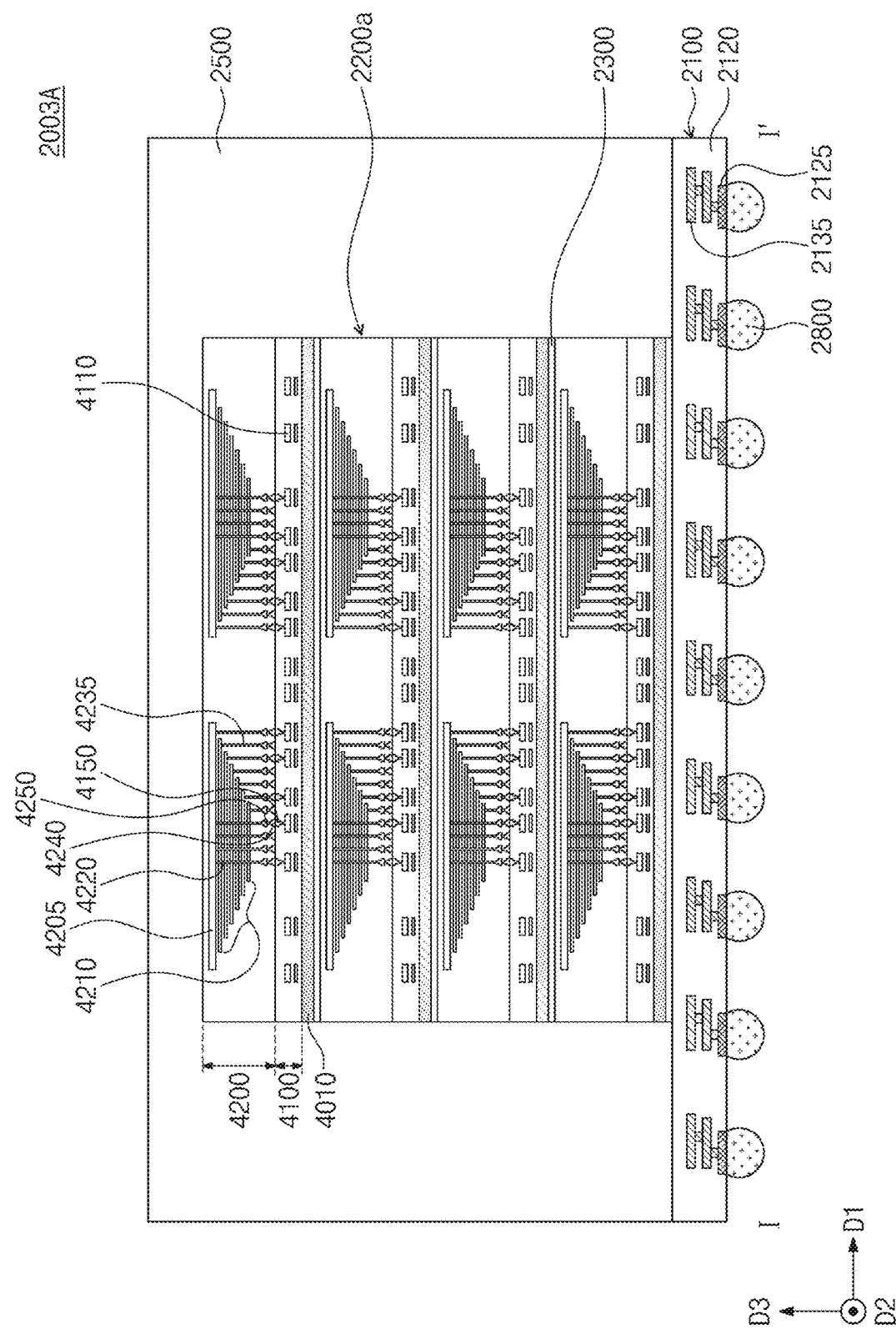

FIGS. 3 and 4 are sectional views schematically illustrating semiconductor packages according to some example embodiments of inventive concepts. For example, FIGS. 3 and 4 are sectional views, which are taken along a line I-I' of FIG. 2, and illustrate two different examples of the semiconductor package of FIG. 2.

Referring to FIG. 3, in the semiconductor package 2003, the package substrate 2100 may be or may include a printed circuit board. The package substrate 2100 may include a package substrate body portion 2120, the package upper pads 2130 (e.g., of FIG. 2), which are disposed on a top surface of the package substrate body portion 2120, lower pads 2125, which are disposed on or exposed through a bottom surface of the package substrate body portion 2120, and internal lines 2135, which are provided in the package substrate body portion 2120 to electrically connect the package upper pads 2130 to the lower pads 2125. The package upper pads 2130 may be electrically connected to the connection structures 2400. The lower pads 2125 may be connected to the interconnection patterns 2005, which are provided in the main board 2001 of the electronic system 2000, through conductive connecting portions 2800, as shown in FIG. 2.

Each of the semiconductor chips 2200 may include a semiconductor substrate 3010 and first and second structures 3100 and 3200, which are sequentially stacked on the semiconductor substrate 3010. The first structure 3100 may include a peripheral circuit region, in which peripheral lines 3110 are provided. The second structure 3200 may include a source structure 3205, the stack 3210 on the source structure 3205, the vertical structures 3220 and separation structures 3230 penetrating the stack 3210, bit lines 3240 electrically connected to the vertical structures 3220, and cell contact plugs 3235 electrically connected to the word lines WL (e.g., of FIG. 1) of the stack 3210. Each of the first and second structures 3100 and 3200 and the semiconductor chips 2200 may further include separation structures to be described below.

Each of the semiconductor chips 2200 may include penetration lines 3245, which are electrically connected to the peripheral lines 3110 of the first structure 3100 and are extended into the second structure 3200. The penetration line 3245 may be disposed outside the stack 3210, and in some example embodiments, the penetration line 3245 may be provided to further penetrate the stack 3210. Each of the semiconductor chips 2200 may further include the input/output pad 2210 (e.g., see FIG. 2), which are electrically connected to the peripheral lines 3110 of the first structure 3100.

Referring to FIG. 4, in a semiconductor package 2003A, each of semiconductor chips 2200a may include a semiconductor substrate 4010, a first structure 4100 on the semiconductor substrate 4010, and a second structure 4200, which is provided on the first structure 4100 and is bonded with the first structure 4100 in a wafer bonding manner.

The first structure 4100 may include a peripheral circuit region, in which a peripheral line 4110 and first junction structures 4150 are provided. The second structure 4200 may include a source structure 4205, a stack 4210 between the source structure 4205 and the first structure 4100, vertical structures 4220 and a separation structure 4230 penetrating the stack 4210, and second junction structures 4250, which are respectively and electrically connected to the vertical structures 4220 and the word lines WL (e.g., of FIG. 1) of the stack 4210. For example, the second junction structures 4250 may be electrically and respectively connected to the vertical structures 4220 and the word lines WL (e.g., of FIG. 1) through bit lines 4240, which are electrically connected to the vertical structures 4220, and cell contact plugs 4235, which are electrically connected to the word lines WL (e.g., of FIG. 1). The first junction structures 4150 of the first structure 4100 may be in contact with and coupled to the second junction structures 4250 of the second structure 4200. The coupled portions of the first junction structures 4150 and the second junction structures 4250 may be formed of or include, for example, copper (Cu); however, example embodiments are not limited thereto.

Each of the first and second structures 4100 and 4200 and the semiconductor chips 2200a may further include a source structure, as will be described below with reference to some example embodiments. Each of the semiconductor chips 2200a may further include the input/output pads 2210 (e.g., of FIG. 2), which are electrically connected to the peripheral lines 4110 of the first structure 4100.

The semiconductor chips 2200 or 2200a of FIG. 3 or 4 may be electrically connected to each other by the connection structures 2400, which are provided in the form of bonding wires. Alternatively or additionally, in some example embodiments, semiconductor chips, which are provided in the same semiconductor package as the semiconductor chips 2200 or 2200a of FIG. 3 or 4, may be electrically connected to each other by a connection structure including through silicon vias (TSVs).

The first structure 3100 or 4100 of FIG. 3 or 4 may correspond to a peripheral circuit structure in some example embodiments to be described below, and the second and second structure 3200 or 4200 of FIG. 3 or 4 may correspond to a cell array structure in some example embodiments to be described below.

Figure 5:
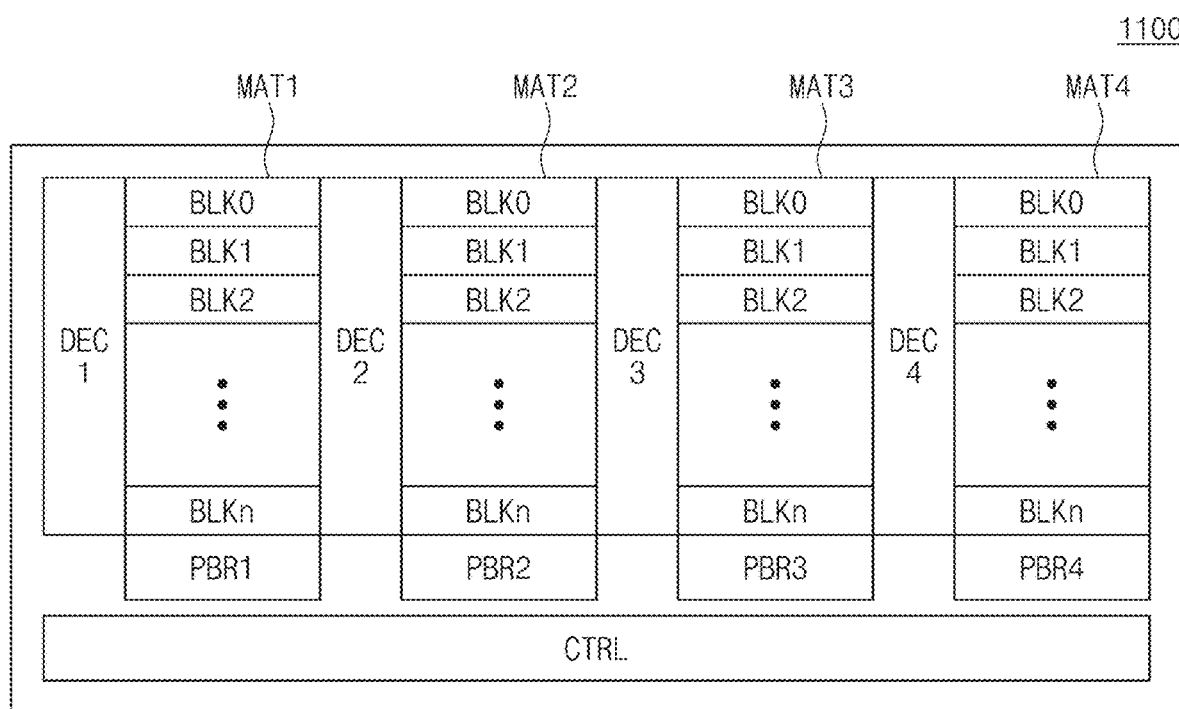
FIG. 5 is a block diagram illustrating a semiconductor device according to some example embodiments of inventive concepts.

FIG. 5 is a block diagram illustrating a semiconductor device according to some example embodiments of inventive concepts.

Referring to FIG. 5, the semiconductor device 1100 may include a plurality of mats MAT1, MAT2, MAT3, and MAT4, a plurality of decoder circuits DEC1, DEC2, DEC3, and DEC4, a plurality of page buffers PBR1, PBR2, PBR3, and PBR4, and at least one control logic CTRL. The semiconductor device 1100 may be a nonvolatile memory device (e.g., a NAND FLASH memory device), as described above.

Each of the mats MAT1, MAT2, MAT3, and MAT4 may include a plurality of blocks BLK0, BLK1, BLK2, ..., BLKn. Each of the blocks BLK0, BLK1, BLK2, ..., BLKn may include a plurality of pages (not shown).

The semiconductor device 1100 may be configured to perform a specific (or, alternatively, predetermined) operation on each page, each block, and/or each mat. For example, the semiconductor device 1100 may perform a data reading operation on each page, and/or a data erasing operation on each block, and/or data an individual operation (e.g., at least one of writing/reading/erasing operations) on each mat.

Each of the memory blocks BLK0, BLK1, BLK2, ..., BLKn may include a plurality of memory cells MCT (e.g., see FIG. 1), which are respectively provided at intersections of the word lines WL (e.g., see FIG. 1) and the bit lines BL (e.g., see FIG. 1). Here, each of the memory cells MCT (e.g., see FIG. 1) may be configured to store data of one or more bits. The memory cell MCT may be a single-level cell, or may be a multi-level cell, or may be a triple-level cell; however, example embodiments are not limited thereto, and the memory cell MCT may store one or more bits.

The mats MAT1, MAT2, MAT3, and MAT4 may be connected to the decoder circuits DEC1, DEC2, DEC3, and DEC4 and the page buffers PBR1, PBR2, PBR3, and PBR4.

The decoder circuits DEC1, DEC2, DEC3, and DEC4 may receive and decode a common address and may select one of the memory blocks BLK0, BLK1, BLK2, ..., BLKn of each of the mats MAT1, MAT2, MAT3, and MAT4, based on the decoded result.

The page buffers PBR1, PBR2, PBR3, and PBR4 may be connected to the mats, respectively, through a plurality of bit lines. Each of the page buffers may temporarily store data, which will be programmed in memory cells corresponding to an input address, and/or are read from memory cells corresponding to an input address, in a selected memory block.

The control logic CTRL may be connected to the decoder circuits DEC1, DEC2, DEC3, and DEC4 and the page buffers PBR1, PBR2, PBR3, and PBR4. The control logic CTRL may control the writing and/or the reading and and/or the erasing operations, based on control signals provided from the outside.

Figure 6:
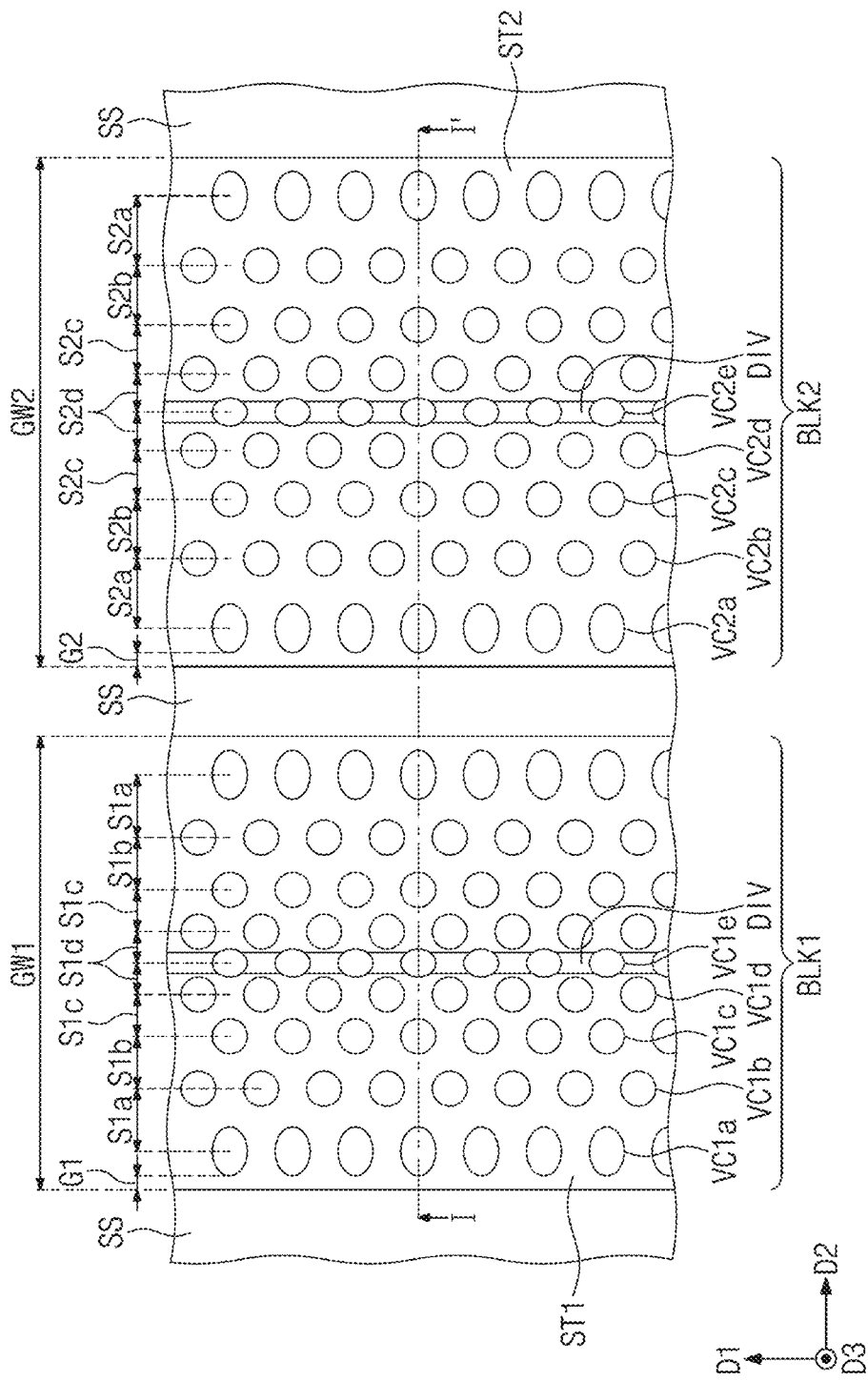
FIG. 6 is a plan view illustrating a portion of a semiconductor device according to some example embodiments of inventive concepts.
Figure 7:
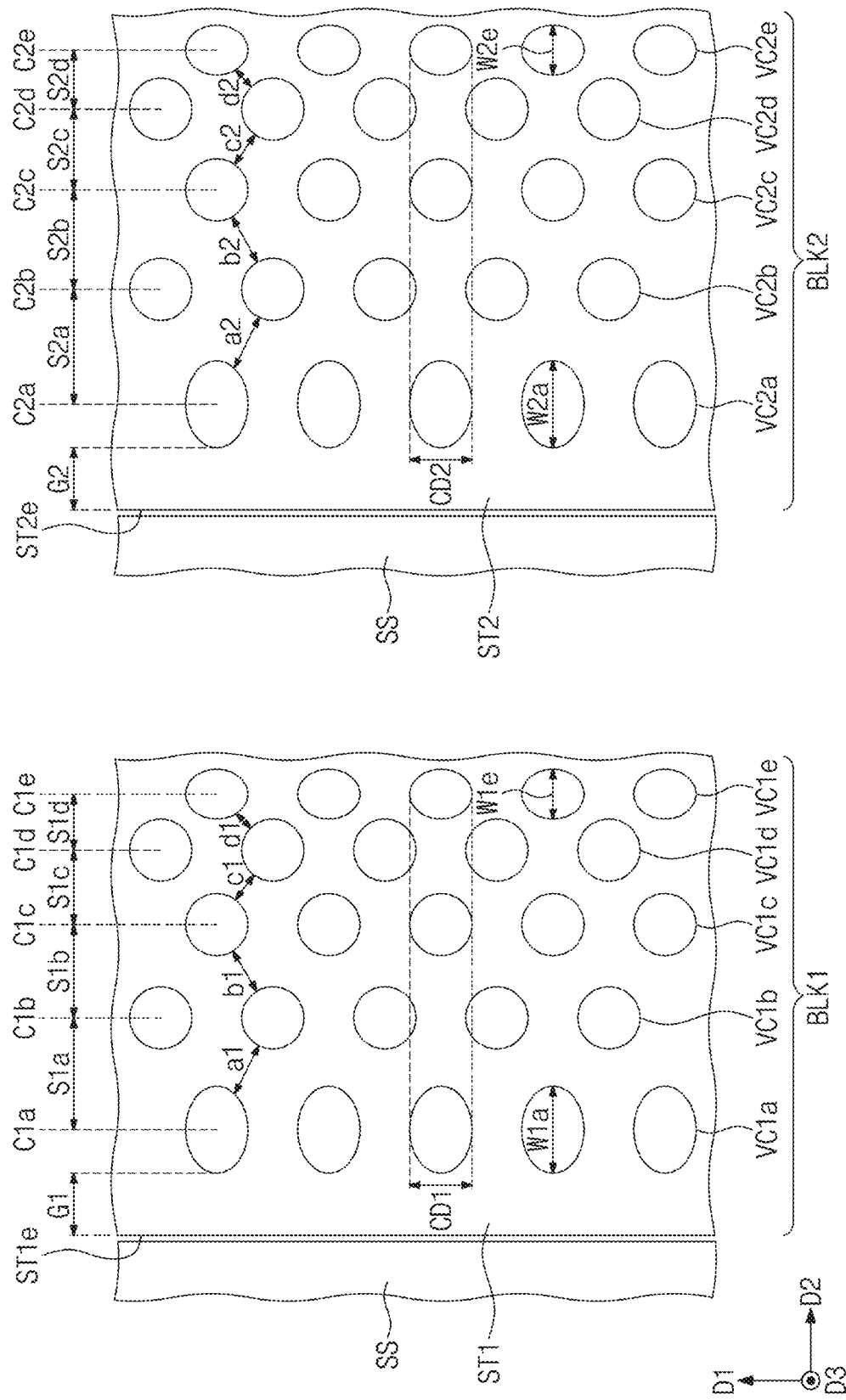
FIG. 7 is an enlarged plan view, which illustrates two portions of FIG. 6 and illustrates an example arrangement of vertical channels of a semiconductor device according to some example embodiments of inventive concepts.
Figure 8:
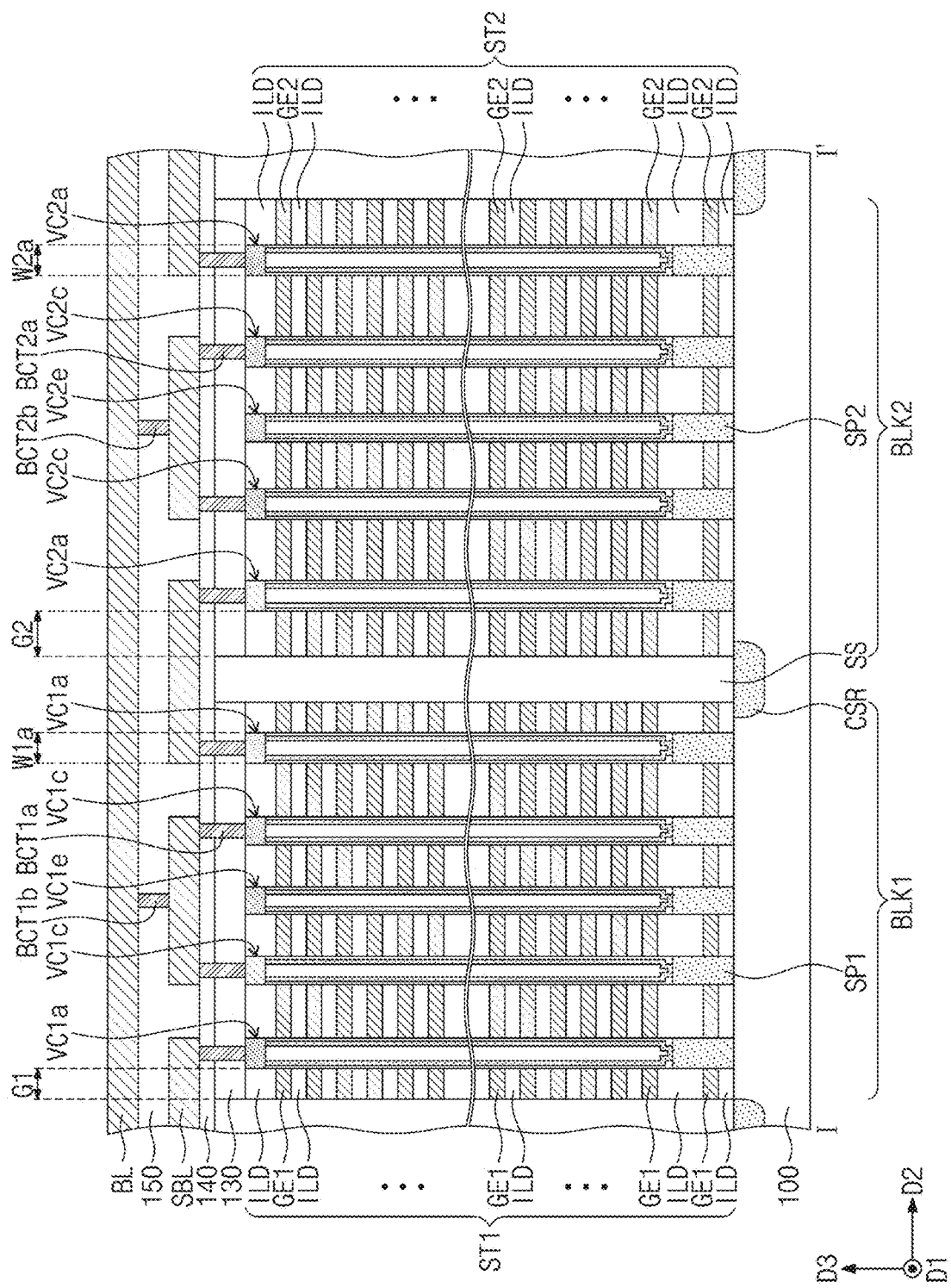
FIG. 8 is a sectional view, which is taken along a line I-I' of FIG. 6 to illustrate a portion of a semiconductor device according to some example embodiments of inventive concepts.

FIG. 6 is a plan view illustrating a portion of a semiconductor device according to some example embodiments of inventive concepts. FIG. 7 is an enlarged plan view, which illustrates two portions of FIG. 6 and illustrates an example arrangement of vertical channels of a semiconductor device according to some example embodiments of inventive concepts. FIG. 8 is a sectional view, which is taken along a line I-I' of FIG. 6 to illustrate a portion of a semiconductor device according to some example embodiments of inventive concepts.

Referring to FIGS. 6, 7, and 8, the first cell block BLK1 and the second cell block BLK2 may be provided on a substrate 100. The first cell block BLK1 may include a first electrode structure ST1, which is disposed on the substrate 100, and first channels VC1a, VC1b, VC1c, VC1d, and VC1e, which are provided to penetrate the first electrode structure ST1. The second cell block BLK2 may include a second electrode structure ST2, which is disposed on the substrate 100, and second channels VC2a, VC2b, VC2c, VC2d, and VC2e, which are provided to penetrate the second electrode structure ST2.

In some example embodiments, a plurality of the first cell blocks BLK1 may be provided in a center region of each of the mats MAT1, MAT2, and MAT3 described with reference to FIG. 5, the second cell block BLK2 may be provided in an edge region of each of the mats MAT1, MAT2, and MAT3 of FIG. 5. For example the first cell block BLK1 described in FIG. 6 may correspond a block labeled as BLK0 in FIG. 5.

The substrate 100 may include at least one of a semiconductor material (e.g., doped or undoped single-crystal or polycrystalline or amorphous silicon), an insulating material (e.g., glass), or a semiconductor or conductive material covered with an insulating material. For example, the substrate 100 may be or may include a silicon wafer of a first conductivity type (e.g. P-type).

The first and second electrode structures ST1 and ST2 may be extended in a first direction D1 parallel to each other and may be spaced apart from each other in a second direction D2 perpendicular to the first direction D1. Here, the first and second directions D1 and D2 may be parallel to a top surface/horizontal surface of the substrate 100

The first electrode structure ST1 may have a first width GW1 in the second direction D2, and the second electrode structure ST2 may have a second width GW2, which is larger than or greater than the first width GW1, in the second direction D2.

The first electrode structure ST1 may include insulating layers ILD and first electrodes GE1, which are alternatingly stacked in a third direction D3 that is perpendicular to the first and second directions D1 and D2. The second electrode structure ST2 may include the insulating layers ILD and second electrodes GE2, which are alternatingly stacked in the third direction D3.

The first and second electrodes GE1 and GE2 may be formed of or may include at least one of doped semiconductor materials (e.g., doped silicon such as doped polysilicon and so forth), metals (e.g., at least one of tungsten, copper, aluminum, and so forth), conductive metal nitrides (e.g., at least one of titanium nitride, tantalum nitride, and so forth), or transition metals (e.g., at least one of titanium, tantalum, and so forth). The insulating layers ILD may include a silicon oxide layer and/or a low-k dielectric layer.

Common source regions CSR may be provided in the substrate 100 and at both sides of the first and second electrode structures ST1 and ST2. The common source regions CSR may be extended parallel to the first and second electrode structures ST1 and ST2 or in the first direction D1 and may be spaced apart from each other in the second direction D2. The common source regions CSR may be formed by doping, e.g. implanting, the substrate 100 of the first conductivity type with impurities of a second conductivity type, and in some example embodiments, the common source regions CSR may contain n-type impurities (e.g., arsenic (As) and/or phosphorus (P)).

Separation structures SS may be provided at both sides of the first and second electrode structures ST1 and ST2. For example, each of the first and second electrode structures ST1 and ST2 may be disposed between adjacent ones of the separation structures SS. The separation structures SS may be extended in the first direction D1 parallel to the first and second electrode structures ST1 and ST2 and may have a substantially uniform width in the second direction D2. The separation structures SS may have top surfaces that are located at a level higher than top surfaces of the first and second channels VC1a to VC1e and VC2a to VC2e. The separation structures SS may include an insulating layer covering side surfaces of the first and second electrode structures ST1 and ST2.

The uppermost ones of the first electrodes GE1 of the first electrode structure ST1 may be horizontally spaced apart from each other by an insulating dividing pattern DIV. Alternatively or additionally, the uppermost ones of the second electrodes GE2 of the second electrode structure ST2 may be horizontally spaced apart from each other by the insulating dividing pattern DIV. In some example embodiments, insulating dividing patterns DIV may be formed of or include silicon oxide.

The first channels VC1a to VC1e may be provided on the substrate 100 to extend in the third direction D3 and to penetrate the first electrode structure ST1. The second channels VC2a to VC2e may be provided on the substrate 100 to extend in the third direction D3 (e.g. vertically) and to penetrate the second electrode structure ST2.

Referring to FIG. 8, each of the first and second channels VC1a to VC1e and VC2a to VC2e may include a vertical semiconductor pattern and a data storage pattern, which is provided to enclose a side surface of the vertical semiconductor pattern. For example, the vertical semiconductor pattern may have a pipe or macaroni shape with closed bottom. The vertical semiconductor pattern may have a 'U'-shaped section or a cup-shaped section, and an internal space of the vertical semiconductor pattern may be filled with an insulating material. The vertical semiconductor pattern may be formed of or include at least one of semiconductor materials (e.g., silicon (Si), germanium (Ge) or compounds thereof), and may be single-crystal or polycrystalline. The vertical semiconductor pattern, which includes the semiconductor material, may be used as channel regions of the upper transistors UT1 and UT2, the memory cell transistors MCT, and the lower transistors LT1 and LT2 described with reference to FIG. 1.

The data storage pattern may include a tunnel insulating layer, a charge storing layer, and a blocking insulating layer, which constitute a data storage element of a NAND FLASH memory device.

In some example embodiments, as shown in FIG. 8, a first semiconductor pillar SP1 may be provided between the first channels VC1a to VC1e and the substrate 100, and a second semiconductor pillar SP2 may be provided between the second channels VC2a to VC2e and the substrate 100.

The first and second semiconductor pillars SP1 and SP2 may penetrate the first and second electrodes GE1 and GE2, respectively, which are provided at the lowermost level of the first and second electrode structures ST1 and ST2. The first and second semiconductor pillars SP1 and SP2 may be in contact with or in direct contact with the substrate 100 and may include an epitaxial layer (e.g. a homogeneous or heterogeneous epitaxial layer) grown from the substrate 100, which is formed of a semiconductor material. The first and second semiconductor pillars SP1 and SP2 may electrically connect the vertical semiconductor patterns of the first and second channels VC1a to VC1e and VC2a to VC2e to the substrate 100. The first and second semiconductor pillars SP1 and SP2 may be formed of or include silicon (Si), but in some example embodiments, they may be formed of or include at least one of germanium (Ge), silicon germanium (SiGe), III-V semiconductor compounds, or II-VI semiconductor compounds, and may be doped or undoped.

In some example embodiments, the first channels VC1a to VC1e in the first cell block BLK1 may be arranged in a manner different from the second channels VC2a to VC2e in the second cell block BLK2.

In detail, referring to FIGS. 6 and 7, the first channels VC1a to VC1e in the first cell block BLK1 may be two-dimensionally arranged in the first and second directions D1 and D2. The first channels VC1a to VC1e may constitute or correspond to a plurality of first columns C1a, C1b, C1c, C1d, and C1e, which are spaced apart from each other in the second direction D2, and the first channels VC1a to VC1e constituting or corresponding to each of the first columns C1a to C1e may be arranged in the first direction D1. The first channels VC1a to VC1e, which are respectively included in adjacent ones of the first columns C1a to C1e, may be spaced apart from each other in a direction that is oblique to the first and second directions D1 and D2, for example in a direction that is 45 degrees to the first and second directions D1 and D2, respectively.

As an example, the first channels VC1a to VC1e in the first cell block BLK1 may be arranged to form nine first columns C1a to C1e. However, in some example embodiments, the number of the first columns C1a to C1e may be less or greater than nine. In each of the first columns C1a to C1e, the first channels VC1a to VC1e may be spaced apart from each other by a constant distance in the first direction D1. Alternatively or additionally, the first channels VC1a to VC1e may have substantially the same channel width (e.g., a width CD1) in the first direction D1.

The first columns C1a to C1e may include first edge columns C1a, which are most adjacent to opposite side surfaces ST1e of the first electrode structure ST1, and a first center column C1e, which is disposed between the first edge columns C1a and is farthest from the opposite side surfaces ST1e. Alternatively or additionally, the first columns C1a to C1e may include first intermediate columns C1b, C1c, and C1d, which are provided between the first edge columns C1a and the first center column C1e. As an example, in the case where the first channels VC1a to VC1e are arranged to form nine first columns C1a to C1e, three first intermediate columns C1b, C1c, and C1d may be provided between the first edge column C1a and the first center column C1e.

The first channels VC1e constituting or corresponding the first center column C1e may dummy channels, which are not used as a part of the memory cell. For example dummy channels may not be electrically active, e.g. may not be connected to an electrically active component. Other channels apart from the dummy channels may be active channels which are electrically active and may be used as part of the memory cells. As an example, the first channels VC1e constituting the first center column C1e may be or correspond to dummy channels, which are not connected to sub-bit lines SBL or the bit lines BL. The first channels VC1a to VC1e may be arranged to have mirror symmetry about the first channels VC1e of the first center column C1e.

In some example embodiments, the first channels VC1a of the first edge column C1a may be spaced apart from one side surface ST1e of the first electrode structure ST1 by a first distance G1.

Distances S1a, S1b, S1c, and S1d between the first columns C1a to C1e may decrease in a direction from the first edge columns C1a toward the first center column C1e (e.g., S1a>S1b>S1c>S1d). The distances S1a, S1b, S1c, and S1d between the first columns C1a to C1e may correspond to distances between centers of the first channels VC1a to VC1e constituting the first columns C1a to C1e.

The smallest distances a1, b1, c1, and d1 between the first channels VC1a to VC1e, which are adjacent to each other in the second direction D2, may decrease in a direction from the first edge columns C1a toward the first center column C1e (e.g., a1>b1>c1>d1).

Widths of the first channels VC1a to VC1e measured in the second direction D2 may decrease in a direction from the first edge column C1a toward the first center column C1e. Here, the widths of the first channels VC1a to VC1e may be values measured at their top levels.

Alternatively or additionally width W1a of the first channels VC1a of the first edge column C1a may be larger than a width W1e of the first channels VC1e of the first center column C1e. A width of the first channels VC1b of the first intermediate column C1b adjacent to the first edge column C1a may be smaller than the width W1a of the first channels VC1a of the first edge column C1a. A width of the first channels VC1d of the first intermediate column C1d adjacent to the first center column C1e may be larger than the width W1e of the first channels VC1e of the first center column C1e.

According to some example embodiments shown in FIGS. 6 and 7, in the second cell block BLK2, the second channels VC2a to VC2e may be two-dimensionally arranged in the first and second directions D1 and D2. The second channels VC2a to VC2e may constitute a plurality of second columns C2a, C2b, C2c, C2d, and C2e, which are spaced apart from each other in the second direction D2, and the second channels VC2a to VC2e constituting or corresponding to each of the second columns C2a to C2e may be arranged in the first direction D1. The second channels VC2a to VC2e, which are respectively included in adjacent ones of the second columns C2a to C2e, may be spaced apart from each other in a direction that is oblique to the first and second directions D1 and D2. As an example, similar to the first cell block BLK1, the second channels VC2a to VC2e in the second cell block BLK2 may be arranged to form nine second columns C2a to C2e. For example, the number of the second channels VC2a to VC2e in the second cell block BLK2 may be equal to the number of the first channels VC1a to VC1e in the first cell block BLK1. In each of the second columns C2a to C2e, the second channels VC2a to VC2e may be spaced apart from each other by a constant distance in the first direction D1. Alternatively or additionally, the second channels VC2a to VC2e may have substantially the same width (e.g., a width CD2) in the first direction D1. In some example embodiments, the width CD2 of the second channels VC2a to VC2e measured in the first direction D1 may be substantially equal to the width CD1 of the first channels VC1a to VC1e.

The second columns C2a to C2e may include the second edge columns C2a, which are most adjacent to opposite side surfaces ST2e of the second electrode structure ST2, and the second center column C2e, which is disposed between the second edge columns C2a and is farthest from the opposite side surfaces ST2e. Furthermore, the second columns C2a to C2e may further include second intermediate columns C2b, C2c, and C2d, which are disposed between the second edge columns C2a and the second center column C2e. In the case where the second channels VC2a to VC2e are arranged to form nine second columns C2a, C2b, C2c, C2d, and C2e, three second intermediate columns C2b, C2c, and C2d may be provided between the second edge column C2a and the second center column C2e.

The second channels VC2e constituting the second center column C2e may dummy channels, which are not used as a part of the memory cell. For example, the second channels VC2e constituting the second center column C2e may be dummy channels, which are not connected to the sub-bit lines SBL and the bit lines BL. The second channels VC2a to VC2e may be arranged to have mirror symmetry about the second channels VC2e of the second center column C2e.

The second channels VC2a of the second edge column C2a may be spaced apart from one side surface ST2e of the second electrode structure ST2 by a second distance G2, and here, the second distance G2 may be different from the first distance G1. For example, the second distance G2 may be larger than the first distance G1.

Widths of the second channels VC2a to VC2e measured in the second direction D2 may decrease in a direction from the second edge column C2a toward the second center column C2e. Here, the widths of the second channels VC2a to VC2e may be values at their top levels. In some example embodiments, a width W2a of the second channels VC2a of the second edge column C2a may be substantially equal to the width W1a of the first channels VC1a of the first edge column C1a. A width W2e of the second channels VC2e of the second center column C2e may be substantially equal to the width W1e of the first channels VC1e of the first center column C1e.

Distances S2a, S2b, S2c, and S2d between the second columns C2a to C2e may decrease in a direction from the second edge columns C2a toward the second center column C2e (e.g., S2a>S2b>S2c>S2d). The distances S2a, S2b, S2c, and S2d between the second columns C2a to C2e may correspond to distances between centers of the second channels VC2a to VC2e constituting the second columns C2a to C2e.

In some example embodiments, the distances S2a, S2b, S2c, and S2d between the second columns may be different from the distances S1a, S1b, S1c, and S1d between the first columns.

In detail, referring to FIG. 7, the distance S1a between the first edge column C1a and the first intermediate column C1b adjacent thereto may be different from the distance S2a between the second edge column C2a and the second intermediate column C2b adjacent thereto. As an example, the distance S1a between the first edge column C1a and the first intermediate column C1b adjacent thereto may be smaller than the distance S2a between the second edge column C2a and the second intermediate column C2b adjacent thereto (e.g., S1a<S2a). The distance S1d between the first center column C1e and the first intermediate column C1b adjacent thereto may be smaller than the distance S2d between the second center column C2e and the second intermediate column adjacent thereto (e.g., S1d<S2d). In addition, the distance S1b or S1c between adjacent ones of the first intermediate columns C1b, C1c, and C1d may be smaller than the distance S2b or S2c between adjacent ones of the second intermediate columns C2b, C2c, and C2d (e.g., S1b<S2b and S1c<S2c).

The smallest distances a2, b2, c2, and d2 between the second channels VC2a to VC2e, which are adjacent to each other in the second direction D2, may decrease in a direction from the second edge column C2a toward the second center column C2e (e.g., a2>b2>c2>d2).

In some example embodiments, the first channel VC1b of the first intermediate column C1b adjacent to the first edge column C1a may be spaced apart from the first channel VC1a of the first edge column C1a by a first smallest distance a1. The second channel VC2b of the second intermediate column C2b adjacent to the second edge column C2a may be spaced apart from the second channel VC2a of the second edge column C2a by a second smallest distance a2. Here, the first smallest distance a1 and the second smallest distance a2 may be different from each other.

The smallest distance d1 between the first channel VC1e of the first center column C1e and the first channel VC1d of the first intermediate column C1d adjacent to the first center column C1e may be different from the smallest distance d2 between the second channel VC2e of the second center column C2e and the second channel VC2d of the second intermediate column C2d adjacent to the second center column C2e.

Alternatively or additionally, the smallest distances b1 and c1 between the first channels VC1b, VC1c, and VC1d of adjacent ones of the first intermediate columns C1b, C1c, and C1d may be different from the smallest distances b2 and c2 between the second channels VC2b, VC2c, and VC2d of adjacent ones of the second intermediate columns C2b, C2c, and C2d (e.g., b1≠b2 and c1≠c2).

As described above, since the second channels VC2a to VC2e of the second cell block BLK2 are arranged in a manner different from the first channels VC1a to VC1e of the first cell block BLK1, it may be possible to prevent or suppress the probability of and/or impact of a process failure (e.g., a failure such as the substrate 100 not being opened by the channel holes), which may occur when the second channels VC2a to VC2e of the second cell block BLK2 are formed in the edge region of each of the mats MAT1, MAT2, MAT3 of FIG. 5, and MAT4.

Referring further to FIG. 8, first to fourth upper insulating layers 130, 140, 150, and 160 may be sequentially stacked on the first and second electrode structures ST1 and ST2.

First lower bit line contact plugs BCT1a may be provided to penetrate the first and second upper insulating layers 130 and 140 and may be connected to the first channels VC1a-VC1e, and second lower bit line contact plugs BCT2a may be provided to penetrate the first and second upper insulating layers 130 and 140 and may be connected to the second channels VC2a to VC2e.

The sub-bit lines SBL may be disposed on the second upper insulating layer 140. The sub-bit lines SBL may be patterns that are elongated in the second direction D2 and may be connected to the first or second lower bit line contact plugs BCT1a or BCT2a.

The bit lines BL may be disposed on the third upper insulating layer 150 to cross the first and second electrode structures ST1 and ST2 and to extend in the second direction D2. The bit lines BL may be coupled to the sub-bit lines SBL through the first and second upper bit line contact plugs BCT1b and BCT2b.

One of the sub-bit lines SBL may be connected to the first and second channels VC1a and VC2a of the first and second edge columns C1a and C2a, which are adjacent to each other in the second direction D2, through the first and second lower bit line contact plugs BCT1a and BCT2a.

Figure 9:
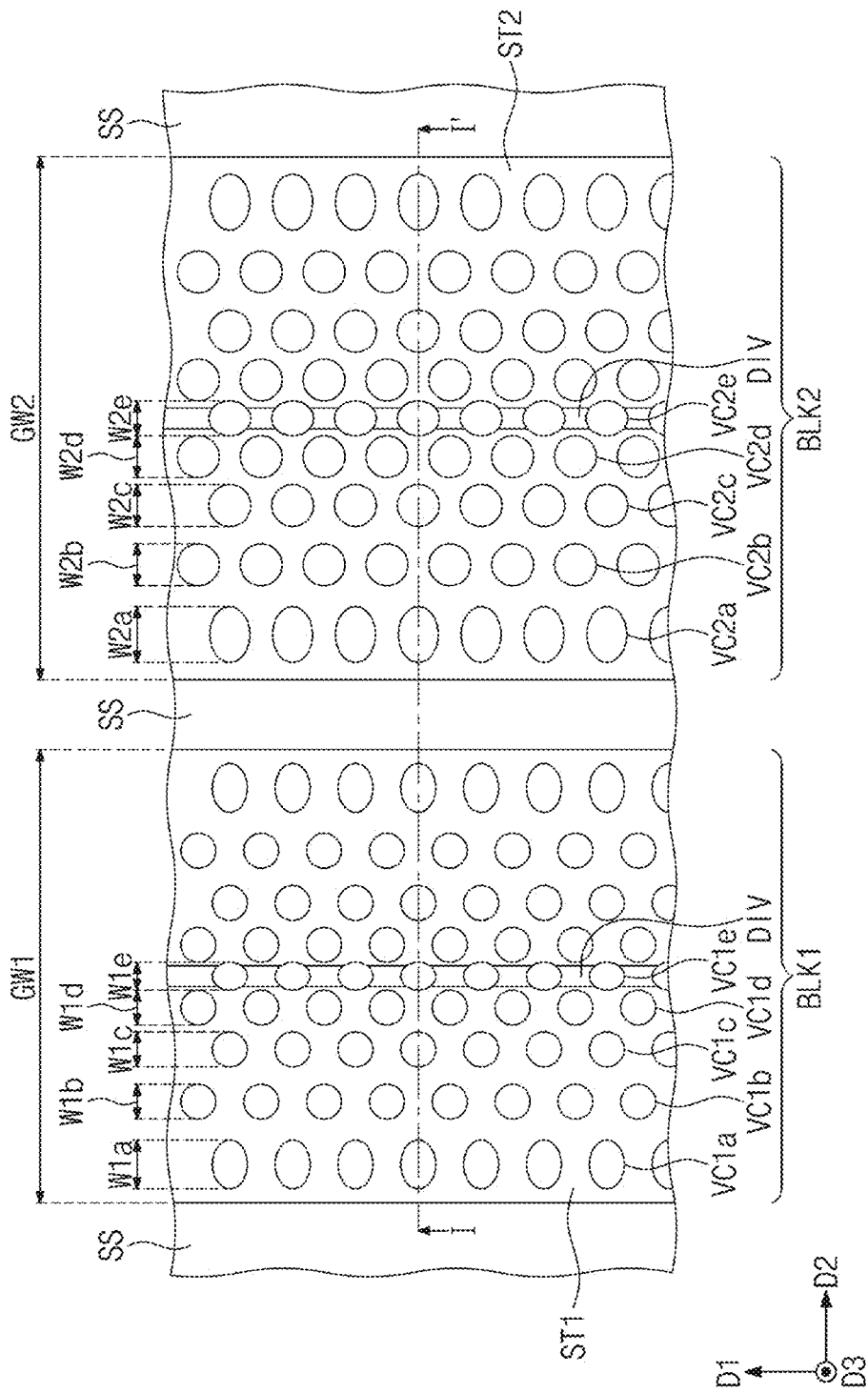
FIG. 9 is a plan view illustrating a portion of a semiconductor device according to some example embodiments of inventive concepts.
Figure 10:
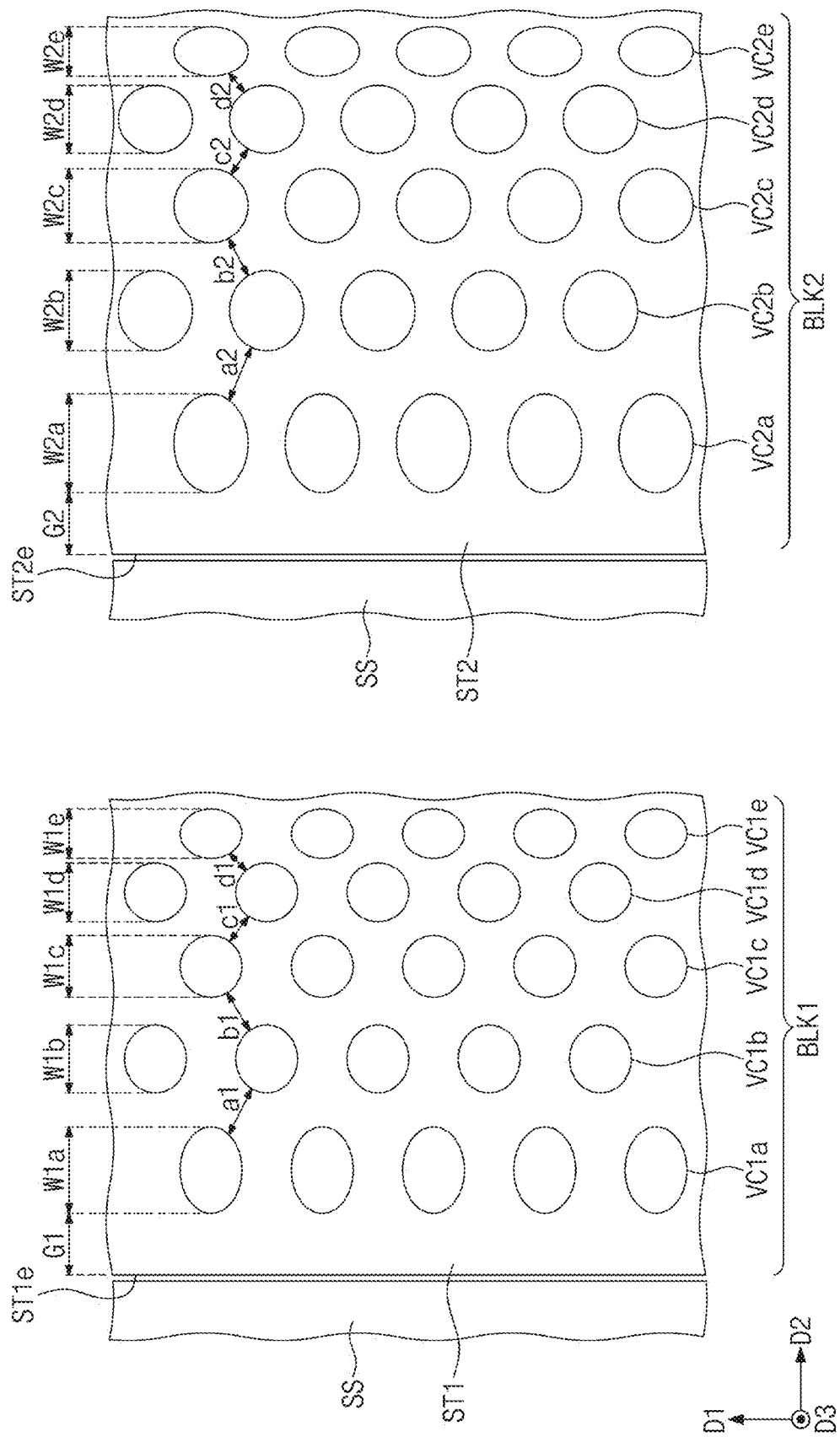
FIG. 10 is an enlarged plan view, which illustrates two portions of FIG. 9 and illustrates an example arrangement of vertical channels of a semiconductor device according to some example embodiments of inventive concepts.
Figure 11:
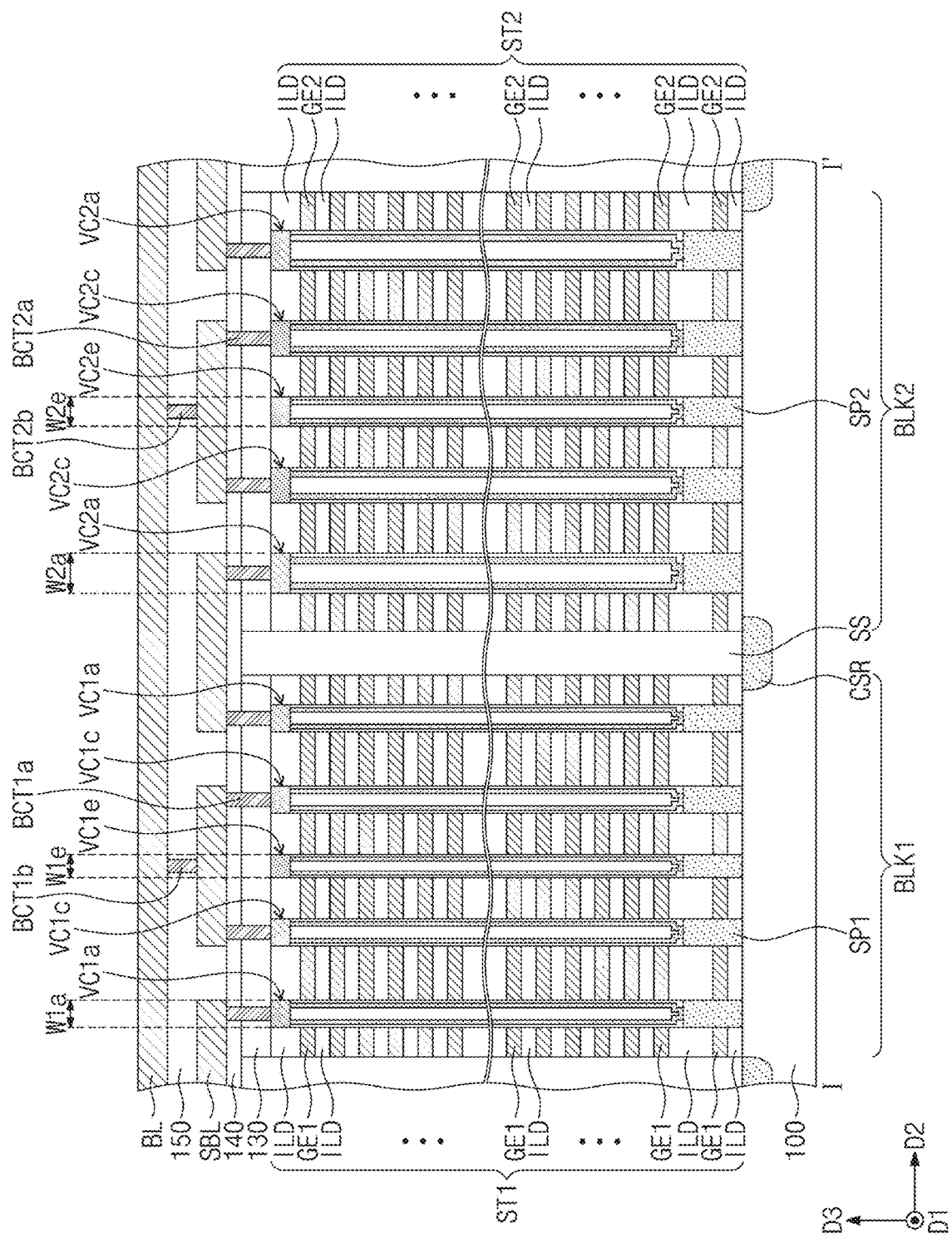
FIG. 11 is a sectional view, which is taken along a line I-I' of FIG. 9 to illustrate a portion of a semiconductor device according to some example embodiments of inventive concepts.

FIG. 9 is a plan view illustrating a portion of a semiconductor device according to some example embodiments of inventive concepts. FIG. 10 is an enlarged plan view, which illustrates two portions of FIG. 9 and illustrates an example arrangement of vertical channels of a semiconductor device according to some example embodiments of inventive concepts. FIG. 11 is a sectional view, which is taken along a line I-I' of FIG. 9 to illustrate a portion of a semiconductor device according to some example embodiments of inventive concepts.

For concise description, an element previously described with reference to FIGS. 6, 7, and 8 may be identified by the same reference number without repeating an overlapping description thereof.

According to some example embodiments shown in FIGS. 9, 10, and 11, as described above, the first electrode structure ST1 may have a first width GW1, and the second electrode structure ST2 may have a second width GW2, which is larger than the first width GW1. In the first cell block BLK1, the first channels VC1a to VC1e may constitute nine first columns C1a to C1e (e.g., see FIG. 7), and in the second cell block BLK2, the second channels VC2a to VC2e may constitute nine second columns C2a to C2e (e.g., see FIG. 7).

The first channels VC1a of the first edge column C1a may be spaced apart from one side surface ST1e of the first electrode structure ST1 by the first distance G1. The second channels VC2a of the second edge column C2a may be spaced apart from one side surface ST2e of the second electrode structure ST2 by the second distance G2, and here, the second distance G2 may be substantially equal to the first distance G1.

The width W2a of the second channels VC2a of the second edge column C2a may be different from the width W1a of the first channels VC1a of the first edge column C1a. For example, the width W2a of the second channels VC2a of the second edge column C2a may be larger than the width W1a of the first channels VC1a of the first edge column C1a (e.g., W1a<W2a).

The width of the second channels VC2e of the second center column C2e may be different from the width of the first channels VC1e of the first center column C1e. For example, the width of the second channels VC2e of the second center column C2e may be larger than the width of the first channels VC1e of the first center column C1e (e.g., W1e<W2e).

In addition, as described above, the widths of the first channels VC1a to VC1e may decrease in a direction from the first edge column C1a toward the first center column C1e (e.g., W1a>W1b>W1c>W1d>W1e). The widths of the second channels VC2a to VC2e may decreased in a direction from the second edge column C2a toward the second center column C2e (e.g., W2a>W2b>W2c>W2d>W2e).

As described above, the smallest distances a1, b1, c1, and d1 between the first channels VC1a to VC1e, which are adjacent to each other in the second direction D2, may decrease in a direction from the first edge columns C1a toward the first center column C1e (e.g., a1>b1>c1>d1).

The smallest distances a2, b2, c2, and d2 between the second channels VC2a to VC2e, which are adjacent to each other in the second direction D2, may decrease in a direction from the second edge column C2a toward the second center column C2e (e.g., a2>b2>c2>d2).

Figure 12:
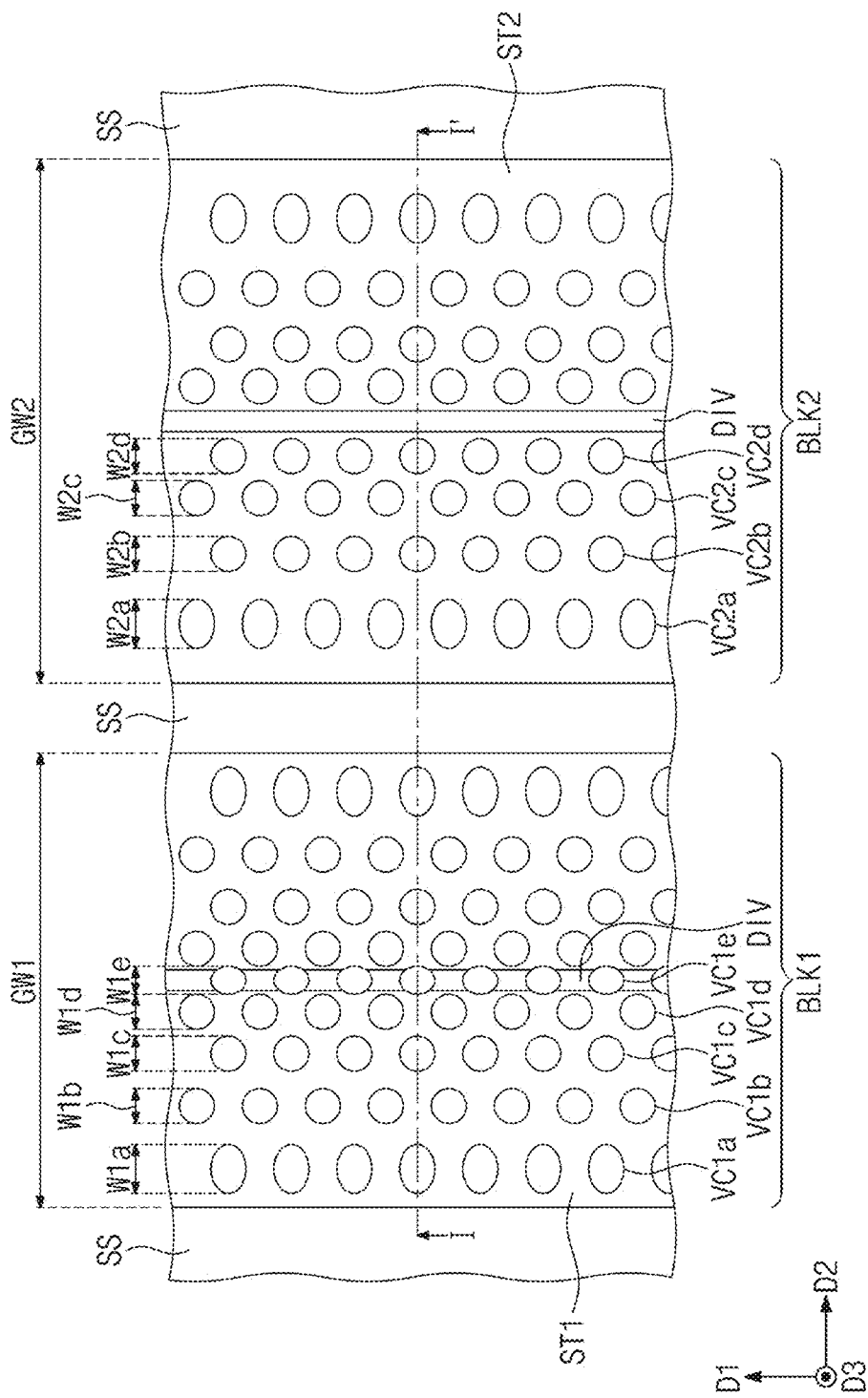
FIG. 12 is a plan view illustrating a portion of a semiconductor device according to some example embodiments of inventive concepts.
Figure 13:
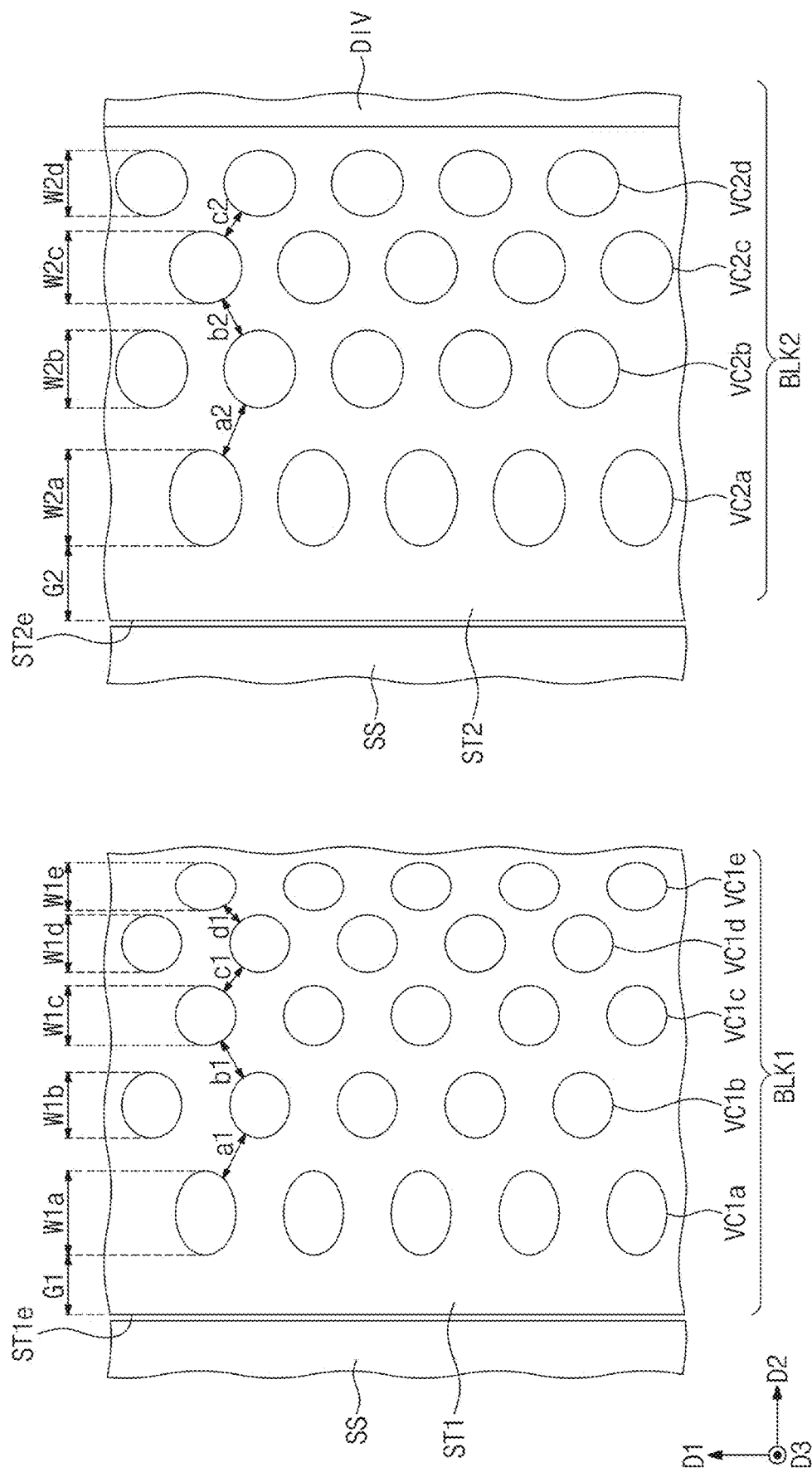
FIG. 13 is an enlarged plan view, which illustrates two portions of FIG. 12 and illustrates an example arrangement of vertical channels of a semiconductor device according to some example embodiments of inventive concepts.
Figure 14:
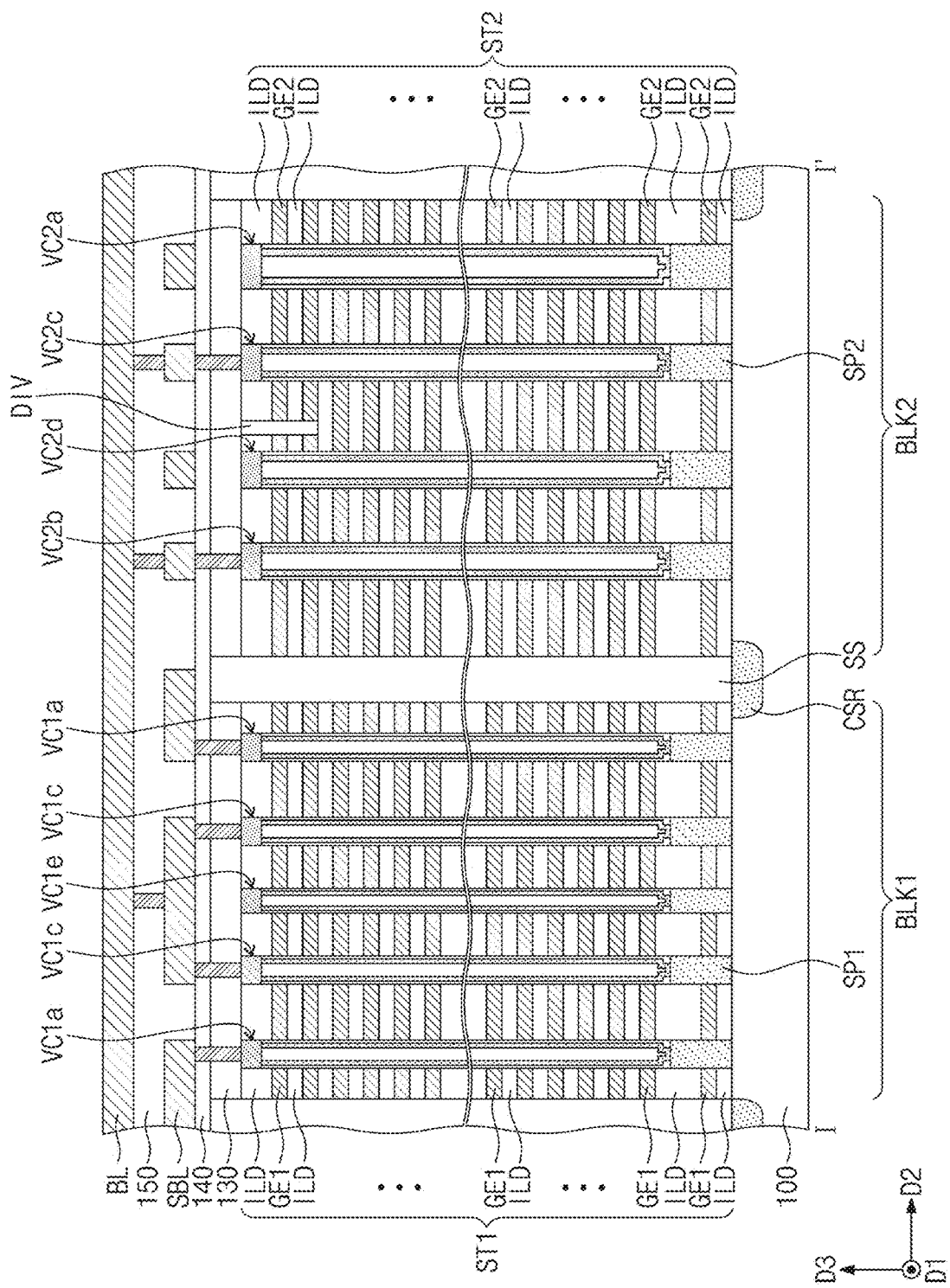
FIG. 14 is a sectional view, which is taken along a line I-I' of FIG. 12 to illustrate a portion of a semiconductor device according to some example embodiments of inventive concepts.

FIG. 12 is a plan view illustrating a portion of a semiconductor device according to some example embodiments of inventive concepts. FIG. 13 is an enlarged plan view, which illustrates two portions of FIG. 12 and illustrates an example arrangement of vertical channels of a semiconductor device according to some example embodiments of inventive concepts. FIG. 14 is a sectional view, which is taken along a line I-I' of FIG. 12 to illustrate a portion of a semiconductor device according to some example embodiments of inventive concepts.

For concise description, an element previously described with reference to FIGS. 6, 7, and 8 may be identified by the same reference number without repeating an overlapping description thereof.

Referring to FIGS. 12, 13, and 14, the first electrode structure ST1 may have a first width GW1, and the second electrode structure ST2 may have a second width GW2, which is larger than the first width GW1. In the first cell block BLK1, the first channels VC1a to VC1e may constitute nine first columns, and in the second cell block BLK2, the second channels VC2a to VC2d may constitute eight second columns. In other words, the number of the second columns in the second cell block BLK2 may be smaller than the number of the first columns in the first cell block BLK1.

The second columns may include second edge columns adjacent to the opposite side surfaces ST2e of the second electrode structure ST2, second center columns adjacent to the insulating dividing pattern DIV, and second intermediate columns between the second edge columns and the second center columns. In other words, the second center columns may be provided at both sides of the insulating dividing pattern DIV, with the insulating dividing pattern DIV interposed therebetween. In the second cell block BLK2, the second columns may be arranged to have mirror symmetry about the insulating dividing pattern DIV.

As described above, the widths of the second channels VC2a to VC2e measured in the second direction D2 may gradually decrease in a direction from the second edge column toward the second center column (e.g., W2a>W2b>W2c>W2d).

The second channels VC2a to VC2e of the second edge column may be spaced apart from one side surface ST2e of the second electrode structure ST2 by the second distance G2. The second distance G2 may be larger than the first distance G1 between one side surface ST1e of the first electrode structure ST1 and the first channels VC1a to VC1e of the first edge column.

Figure 15:
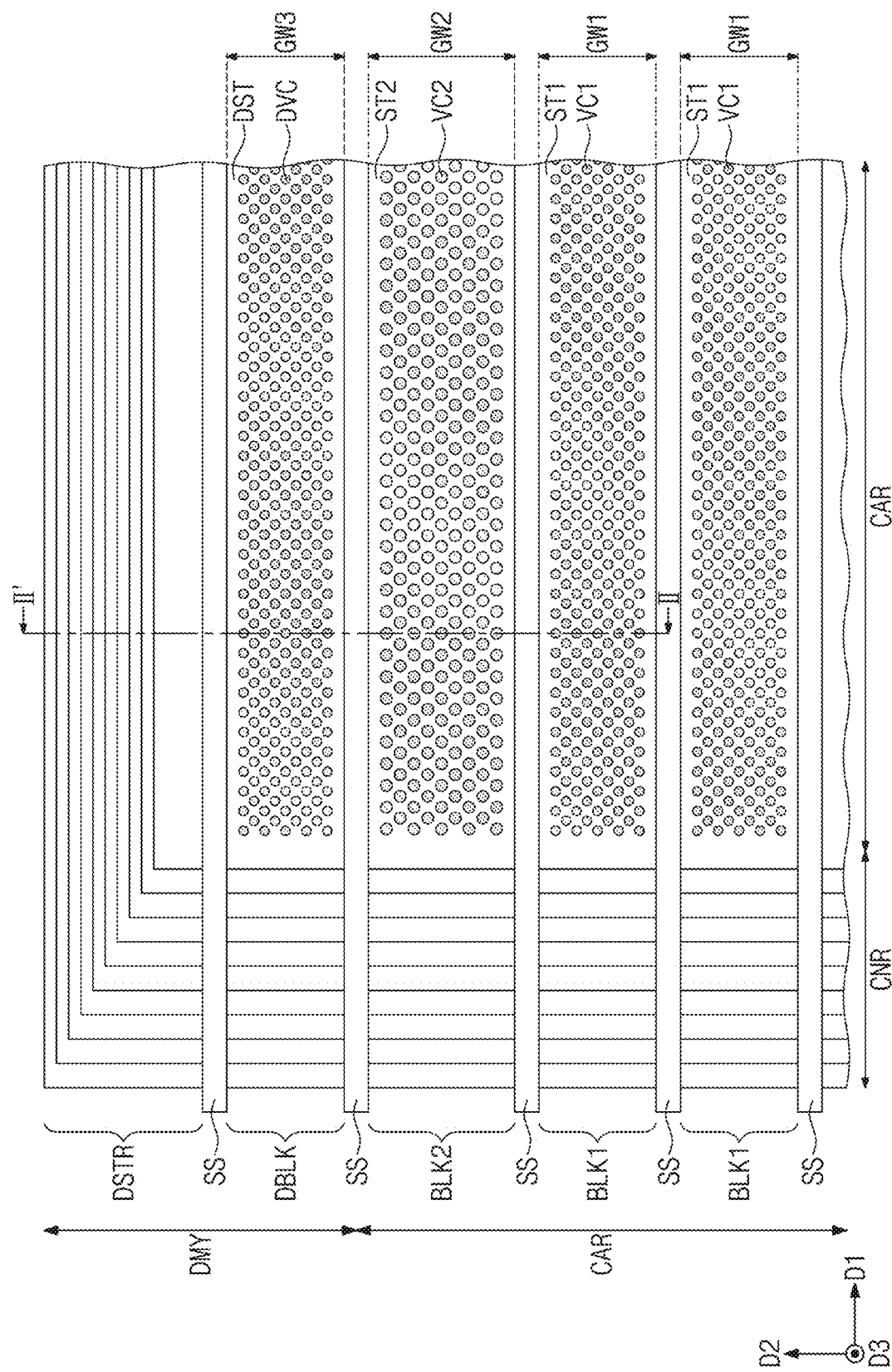
FIG. 15 is a plan view illustrating a portion of a semiconductor device according to some example embodiments of inventive concepts.
Figure 16:
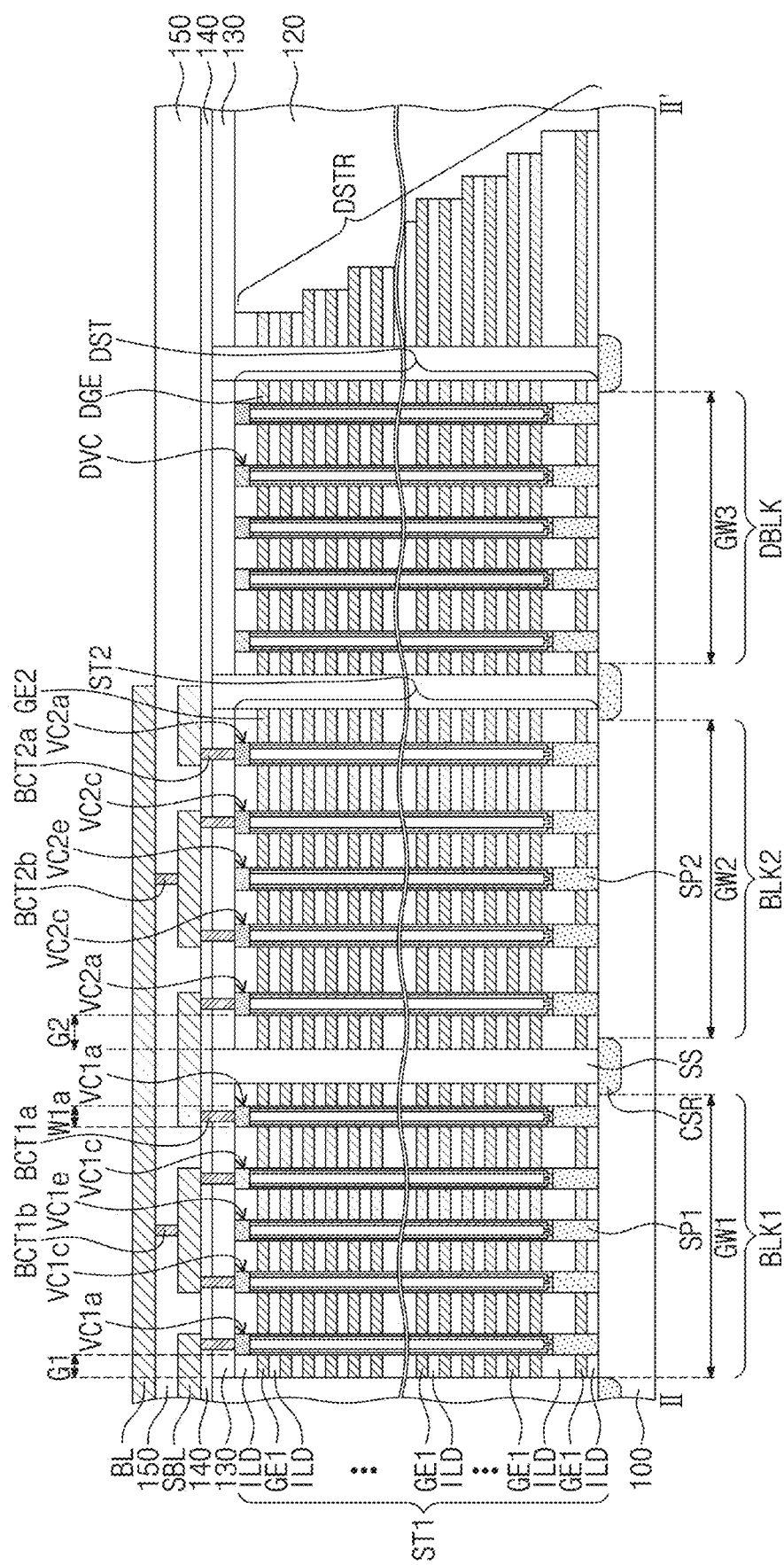
FIG. 16 is a sectional view, which is taken along a line II-II' of FIG. 15 to illustrate a portion of a semiconductor device according to some example embodiments of inventive concepts.

FIG. 15 is a plan view illustrating a portion of a semiconductor device according to some example embodiments of inventive concepts. FIG. 16 is a sectional view, which is taken along a line II-II' of FIG. 15 to illustrate a portion of a semiconductor device according to some example embodiments of inventive concepts.

Referring to FIGS. 15 and 16, the substrate 100 may include a cell array region CAR, a connection region CNR, and a dummy region DMY. The connection region CNR may be provided adjacent to the cell array region CAR in the first direction D1 that is parallel to the top surface of the substrate 100. The dummy region DMY may be provided adjacent to the cell array region CAR in the second direction D2 that is parallel to the top surface of the substrate 100 and is not parallel to the first direction D1.

The first cell blocks BLK1 may be provided in a central portion of the cell array region CAR, and the second cell block BLK2 may be provided in an edge portion of the cell array region CAR. A dummy cell block DBLK may be provided on the dummy region DMY of the substrate 100. Although one second cell block BLK2 and one dummy cell block DBLK are illustrated, the number of the second cell blocks BLK2 and the number of the dummy cell blocks DBLK may be changed.

Each of the first cell blocks BLK1 may include the first electrode structure ST1 and the first channels VC1a to VC1e, as described above. The first electrode structures ST1 of the first cell blocks BLK1 may be extended in the first direction D1 and may be spaced apart from each other in the second direction D2 with the separation structures SS interposed therebetween. The first cell blocks BLK1 may be configured to have substantially the same technical features as the first cell block BLK1 described above.

The second cell block BLK2 may be provided between the first cell block BLK1 and the dummy cell block DBLK. The second cell block BLK2 may include the second electrode structure ST2 and the second channels VC2a to VC2e, as described above. The second cell block BLK2 may be configured to have substantially the same technical features as those described above.

The dummy block or dummy cell block DBLK may include a dummy electrode structure DST extending in the first direction D1 and a plurality of dummy channels DVC penetrating the dummy electrode structure DST. The dummy electrode structure DST may be provided adjacent to the second electrode structure ST2 in the second direction D2, with the separation structure interposed therebetween. The dummy electrode structure DST may include dummy electrodes DGE and insulating layers, which are alternately stacked on the substrate 100 in the third direction D3. The dummy electrode structure DST may have a third width GW3 in the second direction D2, and here, the third width GW3 may be substantially equal to the first width GW1 of the first electrode structure ST1. In other words, the third width GW3 of the dummy electrode structure DST may be smaller than the second width GW2 of the second electrode structure ST2.

The dummy channels DVC may penetrate the dummy electrode structure DST in the third direction D3. In some example embodiments, the dummy channels DVC may be arranged under substantially the same design rule as that for the first channels VC1a to VC1e of the first cell block BLK1. For example, the dummy channels DVC may be arranged to form nine columns, like the first channels VC1a to VC1e, and may be configured to have substantially the same features as the first channels VC1a to VC1e.

In some example embodiments, the dummy channels DVC may not be connected to the lower and upper bit line contact plugs, and the top surfaces of the dummy channels DVC may be completely covered with first upper insulating layer 130.

The first, second, and dummy electrode structures ST1, ST2, and DST may be provided to form a staircase structure in the first direction D1, on the connection region CNR. The staircase structure of the first, second, and dummy electrode structures ST1, ST2, and DST may be defined by the end portions of the first, second, dummy electrodes GE1, GE2, and DGE. An insulating planarization layer 120 may cover the end portions of the first, second, and dummy electrodes GE1, GE2, and DGE.

A dummy staircase structure DSTR, which forms a staircase structure in the second direction D2, may be disposed on the dummy region DMY of the substrate 100. The dummy staircase structure DSTR may be provided adjacent to the dummy electrode structure DST in the second direction D2, with the separation structure SS interposed therebetween. The insulating planarization layer 120 may cover the staircase structure of the dummy staircase structure DSTR. The dummy staircase structure DSTR may include insulating and conductive layers, which are alternately stacked on the substrate 100.

According to some example embodiments of inventive concepts, since the second channels VC2a to VC2e of the second cell block BLK2 adjacent to the dummy cell block DBLK are arranged in a manner different from the first channels VC1a to VC1e, it may be possible to prevent and/or suppress and/or reduce the likelihood of occurrence and/or the impact of a failure from occurring in memory cells, which include the second channels VC2a to VC2e provided in the edge region of the cell array region.

Figure 17:
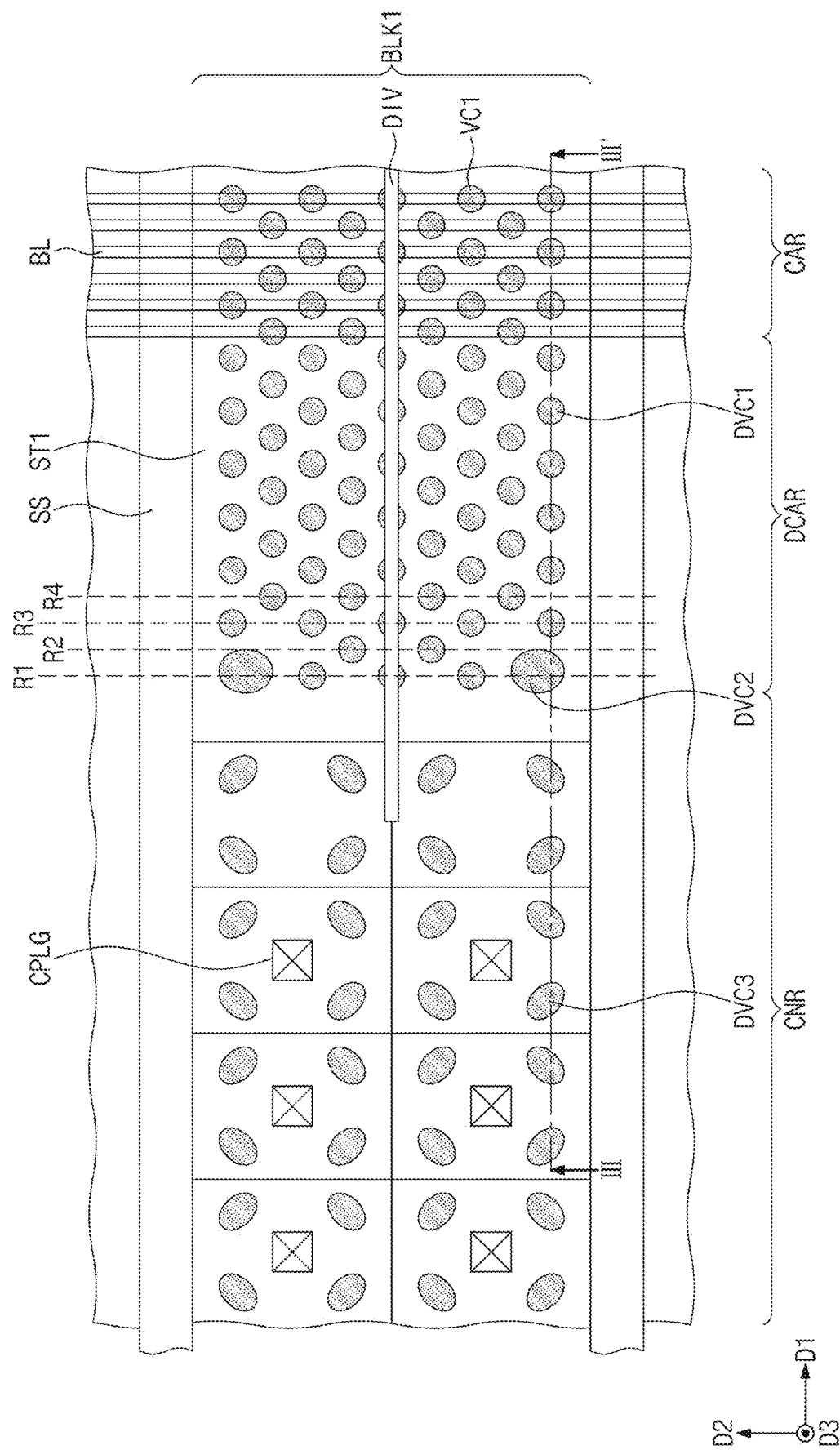
FIG. 17 is a plan view illustrating a portion of a semiconductor device according to some example embodiments of inventive concepts.
Figure 18:
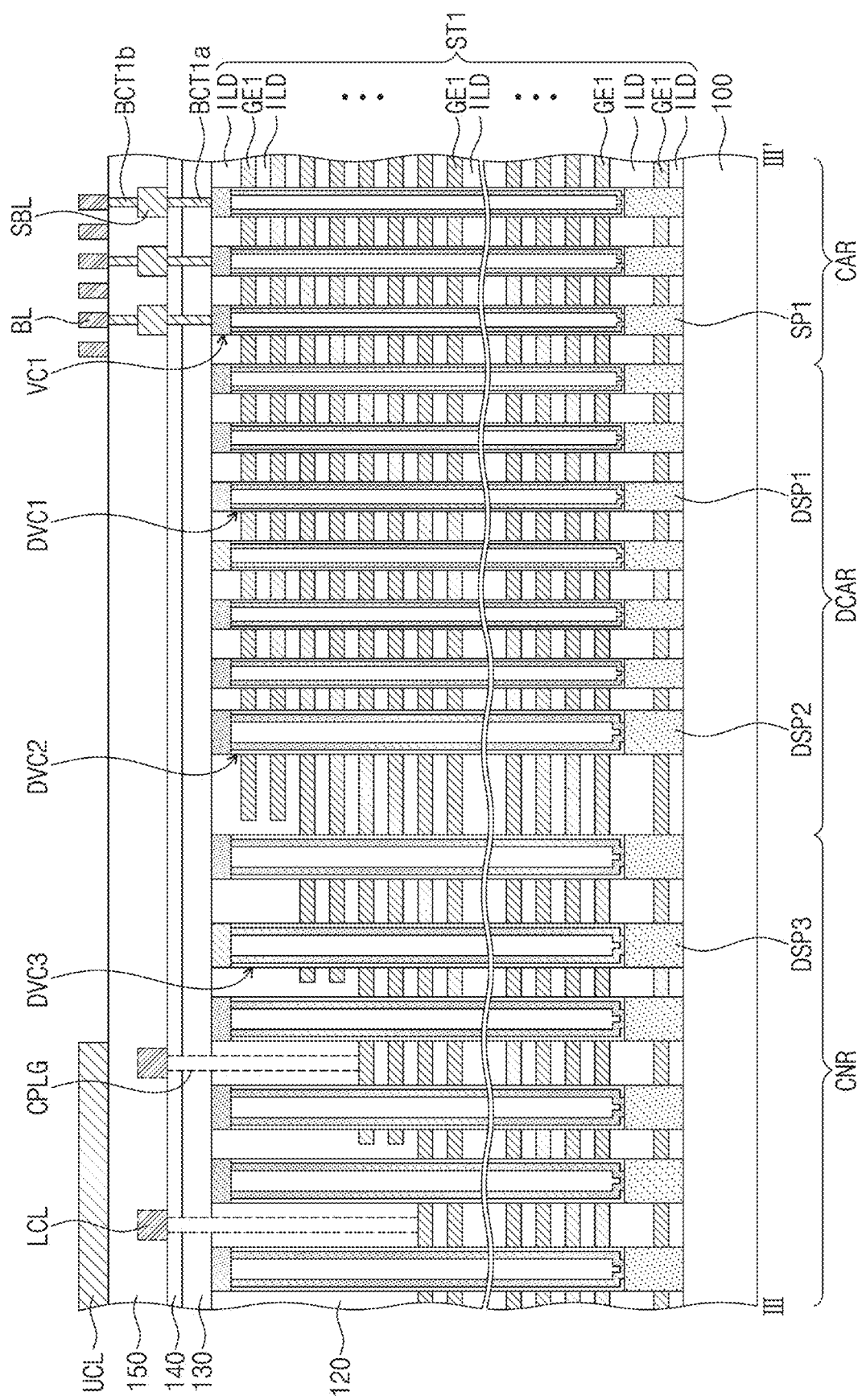
FIG. 18 is a sectional view, which is taken along a line III-III' of FIG. 17 to illustrate a portion of a semiconductor device according to some example embodiments of inventive concepts.

FIG. 17 is a plan view illustrating a portion of a semiconductor device according to some example embodiments of inventive concepts. FIG. 18 is a sectional view, which is taken along a line III-III' of FIG. 17 to illustrate a portion of a semiconductor device according to some example embodiments of inventive concepts.

Referring to FIGS. 17 and 18, the substrate 100 may include a cell array region CAR, a dummy cell array region DCAR, and a connection region CNR. The dummy cell array region DCAR may be provided between the cell array region CAR and the connection region CNR in the first direction D1.

The first cell block BLK1 may be disposed on the substrate 100 and may include the first electrode structure ST1, first channels VC1, first dummy channels DVC1, second dummy channels DVC2, and third dummy channels DVC3.

The first electrode structure ST1 may be extended in the first direction D1 and may have a staircase structure in the connection region CNR. The staircase structure of the first electrode structure ST1 may be defined by the end portions of the first electrodes GE1.

Cell contact plugs CPLG may be provided in the connection region CNR to be coupled to the end portions of the first electrodes GE1, respectively. The cell contact plugs CPLG may have top surfaces that are substantially coplanar with each other. The cell contact plugs CPLG may be electrically connected to lower and upper connection lines LCL and UCL.

The first channels VC1 may penetrate the first electrode structure ST1 in the cell array region CAR. The first and second dummy channels DVC1 and DVC2 may penetrate the first electrode structure ST1 in the dummy cell array region DCAR. The third dummy channels DVC3 may penetrate the first electrode structure ST1 and the insulating planarization layer 120 in the connection region CNR.

In the first cell block BLK1, the first dummy channels or first channels DVC1 or VC1 may be two-dimensionally arranged in the first and second directions D1 and D2.

The first channels VC1 may be electrically connected to the bit lines BL, which are extended in the second direction D2, in the cell array region CAR.

In the dummy cell array region DCAR, the first dummy channels DVC1 may have substantially the same width as the first channels VC1 and may be arranged in the same manner as the first channels VC1. The top surfaces of the first dummy channels DVC1 may be wholly covered with the first upper insulating layer 130 and thus may not be electrically or physically connected to the bit lines BL or other conductive patterns.

In detail, the first dummy channels or first channels DVC1 or VC1 may constitute or correspond to a plurality of rows R1, R2, R3, R4, . . . , which are sequentially arranged in the first direction D1. In each of the rows R1, R2, R3, R4, . . . , the first dummy channels or first channels DVC1 or VC1 may be spaced apart from each other in the second direction D2.

The number of the first dummy channels or first channels DVC1 or VC1 in each of the odd-numbered rows R1, R3, . . . may be different from the number of the first dummy channels or first channels DVC1 or VC1 in in each of the even-numbered rows R2, R4, . . . . For example, the odd-numbered rows R1, R3, . . . may be composed of five first dummy channels or first channels DVC1 or VC1, and the even-numbered rows R2, R4, . . . may be composed of four first dummy channels or first channels DVC1 or VC1. The number of the first dummy channels or first channels DVC1 or VC1 constituting each of the rows R1, R2, R3, R4, . . . is not limited thereto and may be changed according to an integration density of a semiconductor memory device.

The first row R1 of the rows R1, R2, R3, R4, . . . may be closest to the connection region CNR. The number of the first dummy channels DVC1 in the first row R1 may be different from the number of the first dummy channels DVC1 in the third row R3. Alternatively or additionally, the number of the first dummy channels DVC1 in the second row R2 may be different from the number of the first dummy channels DVC1 in the fourth row R4.

The second dummy channels DVC2 may be closest to the connection region CNR in the first direction D1 and may be closest to the separation structures SS in the second direction D2.

The second dummy channels DVC2 may have widths that are larger than the first dummy channels DVC1. Alternatively or additionally, the top surfaces of the second dummy channels DVC2 may have a shape that is different from the top surfaces of the first dummy channels DVC1. The second dummy channels DVC2 may have an elliptical top surface and/or a bar-shaped top surface.

The third dummy channels DVC3 may penetrate the end portions of the first electrodes GE1. A plurality of the third dummy channels DVC3 may be disposed around a corresponding one of the cell contact plugs CPLG, when viewed in a plan view. The third dummy channels DVC3 may have a width larger than the first dummy channels DVC1. The third dummy channels DVC3 may have an elliptical top surface and/or a bar-shaped top surface.

Each of the first channels VC1 and the first, second, and third dummy channels DVC1, DVC2, and DVC3 may include a vertical semiconductor pattern and a data storage pattern, which is provided to enclose a side surface of the vertical semiconductor pattern, as described above. In addition, the first semiconductor pillar SP1 penetrating the lowermost one of the first electrodes GE1 may be provided between the first channels VC1 and the substrate 10, and the first, second, and third dummy semiconductor pillars DSP1, DSP2, and DSP3 penetrating the lowermost one of the first electrodes GE1 may be respectively provided between the first, second, and third dummy channels DVC1, DVC2, and DVC3 and the substrate 10.

Figure 19:
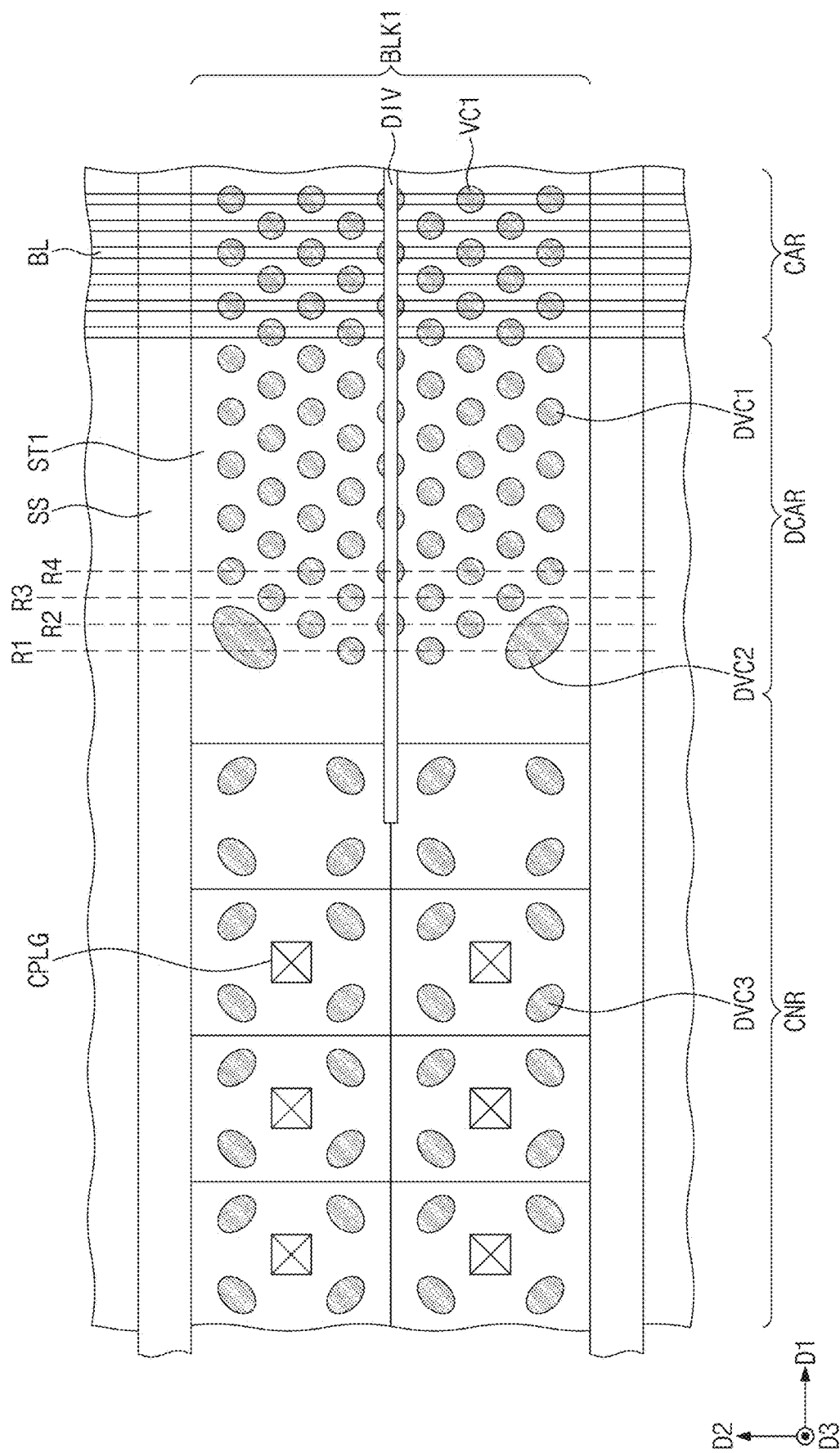
FIGS. 19 and 20 are plan views illustrating a portion of a semiconductor device according to some example embodiments of inventive concepts.
Figure 20:
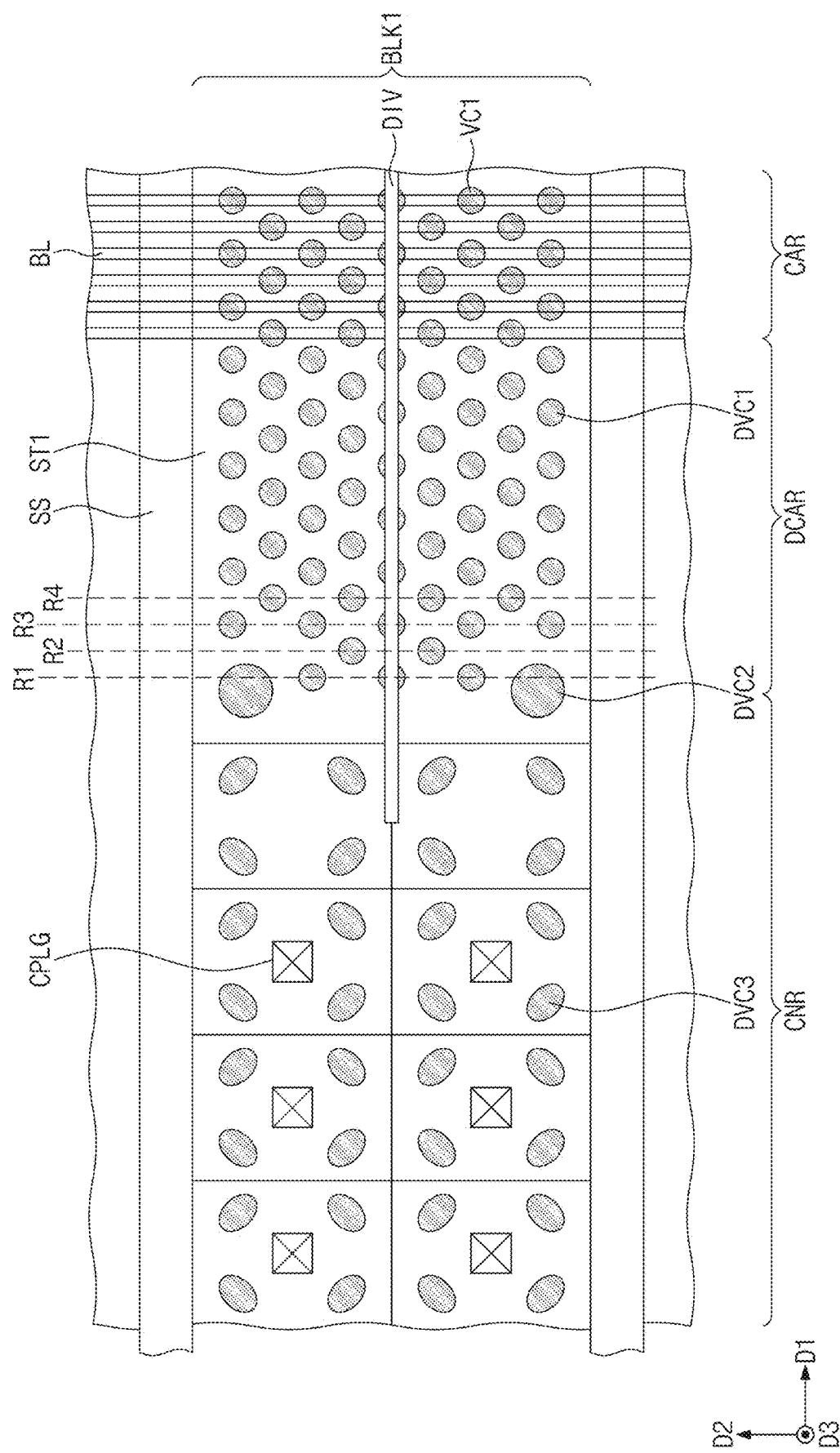

FIGS. 19 and 20 are plan views illustrating a portion of a semiconductor device according to some example embodiments of inventive concepts. For concise description, an element previously described with reference to FIGS. 17 and 18 may be identified by the same reference number without repeating an overlapping description thereof.

Referring to FIG. 19, a plurality of rows R1, R2, R3, R4, . . . , which are composed of the first dummy channels DVC1, may be arranged in the first direction D1. The number of the first dummy channels DVC1 in odd-numbered rows may be greater than the number of the first dummy channels DVC1 in even-numbered rows, but exceptionally, the number of the first dummy channels DVC1 in the first row R1, which is closest to the connection region CNR may be less than the number of the first dummy channels DVC1 in the second row R2.

The second dummy channels DVC2 may have widths that are larger than the first dummy channels DVC1. Each of the second dummy channels DVC2 may have an elliptical top surface or bar-shaped top surface, and the second dummy channel DVC2 may be disposed such that the long axis thereof is oblique to both of the first and second directions D1 and D2.

Referring to FIG. 20, the second dummy channels DVC2 may have widths that are larger than the first dummy channels DVC1, and top surfaces of the second dummy channels DVC2 may have a circular shape.

Figure 21:
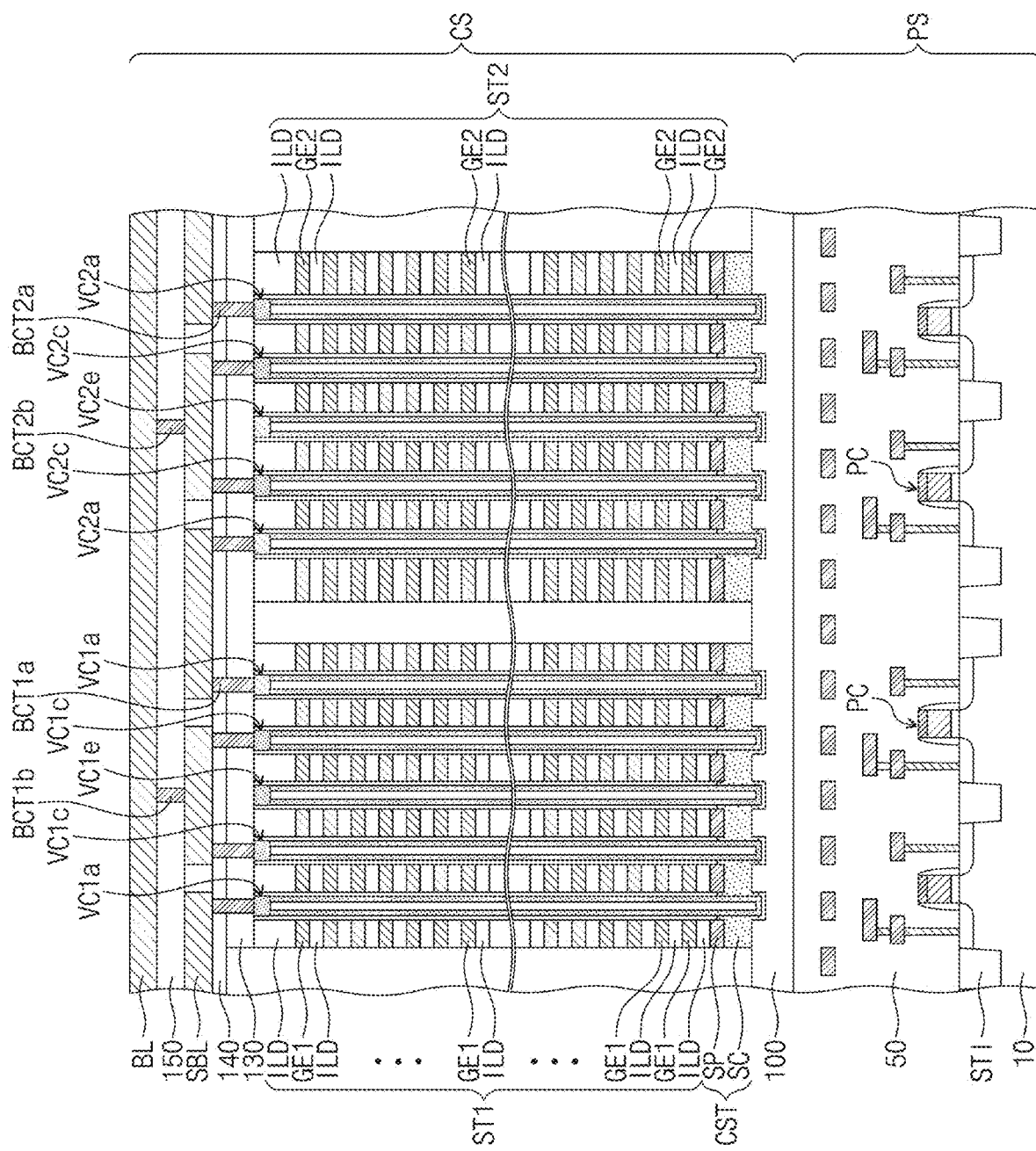
FIGS. 21, 22, and 23 are sectional views illustrating a semiconductor device according to some example embodiments of inventive concepts.

A distance from a side surface of the uppermost one of the first electrodes GE1 to the second dummy channels DVC2 may be smaller than a distance to the outermost one of the first dummy channels DVC1. In other words, the second dummy channel DVC2 may be closer to the connection region CNR than the first dummy channel DVC1. FIG. 21 is a sectional view illustrating a semiconductor device according to some example embodiments of inventive concepts. For concise description, an element previously described with reference to FIGS. 1 to 20 may be identified by the same reference number without repeating an overlapping description thereof.

According to some example embodiments shown in FIG. 21, the semiconductor device may include a peripheral circuit structure PS and a cell array structure CS on the peripheral circuit structure PS.

The peripheral circuit structure PS may include peripheral circuits PC, which are integrated on a top surface of a semiconductor substrate 10, and a lower insulating layer 50, which is provided to cover the peripheral circuits PC.

The semiconductor substrate 10 may include the cell array region CAR and first and second connection regions CNR1 and CNR2, and the first connection region CNR1 may be positioned between the cell array region CAR and the second connection region CNR2 in the first direction D1. In some example embodiments, the semiconductor substrate 10 may be or may include a silicon substrate.

The peripheral circuits PC may be row and column decoders, page buffers, and a control circuit. In detail, the peripheral circuits PC may include NMOS and PMOS transistors. Peripheral circuit interconnection lines may be electrically connected to the peripheral circuits PC through peripheral contact plugs.

The lower insulating layer 50 may be provided on the semiconductor substrate 10. The lower insulating layer 50 may cover the peripheral circuits PC and the peripheral contact plugs and the peripheral circuit interconnection lines, which are electrically connected to the peripheral circuits PC.

The lower insulating layer 50 may include a plurality of stacked insulating layers. For example, the lower insulating layer 50 may include at least one of a silicon oxide layer, a silicon nitride layer, a silicon oxynitride layer, and/or a low-k dielectric layer.

The cell array structure CS may be disposed on the lower insulating layer 50. As described above, the cell array structure CS may include the first cell block BLK1 and the second cell block BLK2, which are provided on the substrate 100. The first cell block BLK1 and the second cell block BLK2 may be configured to have the same technical features as those in the afore-described embodiments.

The substrate 100 may be disposed on the top surface of the lower insulating layer 50. The substrate 100 may be formed of or include at least one of semiconductor materials, insulating materials, or conductive materials. In some example embodiments, the substrate 100 may be formed of or include a doped semiconductor material of the first conductivity type (e.g., n-type) and/or an undoped or intrinsic semiconductor material. The substrate 100 may be formed to have one of polycrystalline, amorphous, and single-crystalline structures.

In some example embodiments, a source structure CST may be provided between the first electrode structure ST1 and the substrate 100 and between the second electrode structure ST2 and the substrate 100.

The source structure CST may include a source conductive pattern SC and a conductive support pattern SP on the source conductive pattern SC. The source structure CST may be parallel to the top surface of the substrate 100 and may be extended from the cell array region CAR in a direction parallel to the stack ST or in the first direction D1.

The source conductive pattern SC may be formed of or include a semiconductor material, which is doped with dopants (e.g., phosphorus (P) or arsenic (As)) of a first conductivity type. As an example, the source conductive pattern SC may be formed of or include a semiconductor layer that is doped with n-type dopants such as at least one of phosphorus or arsenic. The source conductive pattern SC may be in contact with the side surfaces of the vertical semiconductor patterns of the first and second channels.

The conductive support pattern SP may cover a top surface of the source conductive pattern SC and may be formed of or include a doped semiconductor material of the first conductivity type (e.g., n-type) and/or an undoped or intrinsic semiconductor material. In the cell array region CAR, portions of the conductive support pattern SP may penetrate the source conductive pattern SC and may be in contact with the top surface of the substrate 10.

In each of the first and second channels VC1a to VC1e and VC2a to VC2e, a bottom surface of the data storage pattern may be located at a level that is lower than the bottom surface of the lowermost ones of the first and second electrodes GE1 and GE2 and is higher than the top surface of the source conductive pattern SC. As used herein a "lower" level may correspond to a level closer to a surface of the substrate 100, while a "higher" level may correspond to a level further away from a surface of the substrate 100.

Figure 22:
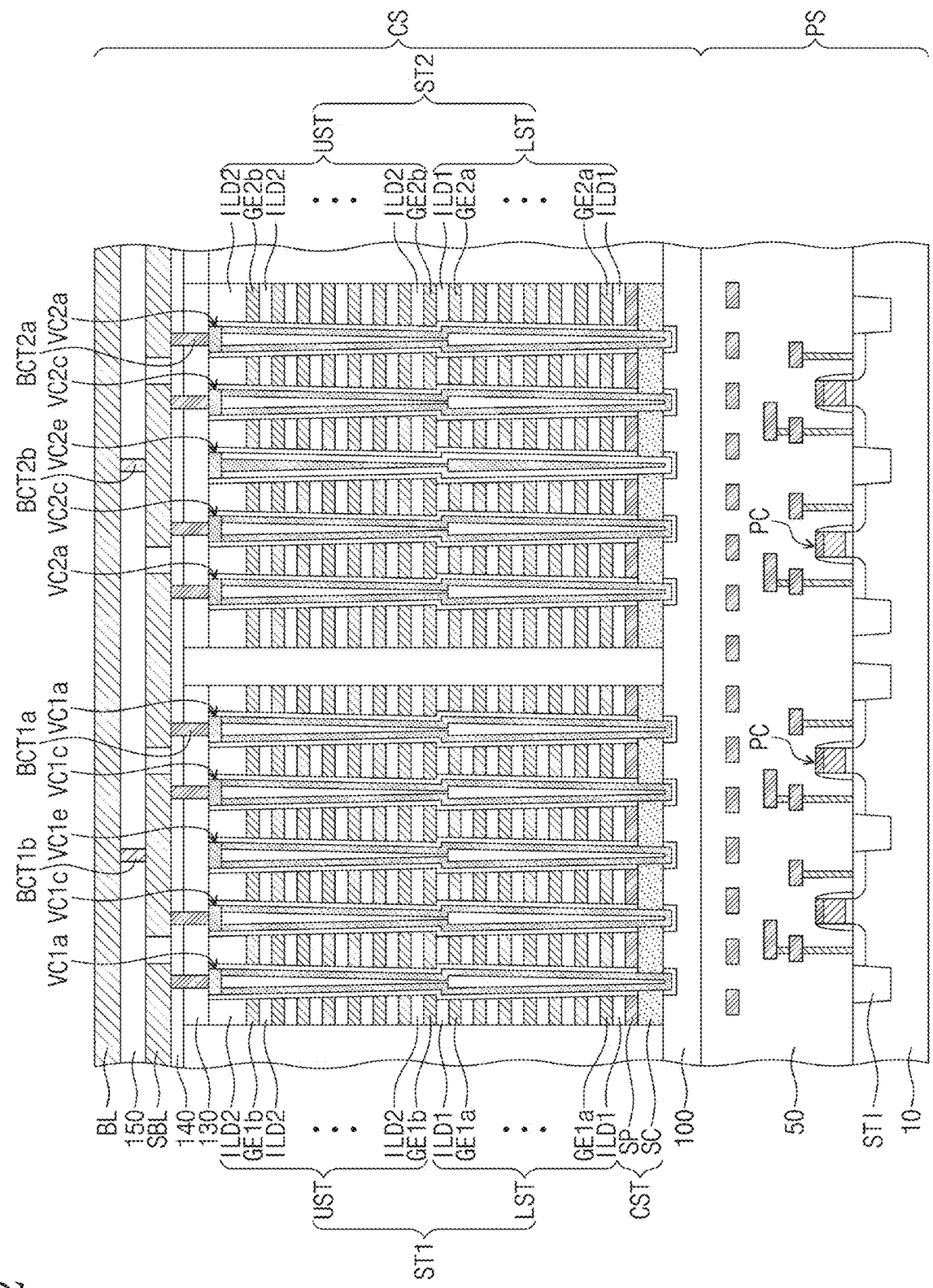

FIG. 22 is a sectional view illustrating a semiconductor device according to some example embodiments of inventive concepts. For concise description, the same element as the semiconductor device previously described with reference to FIG. 21 may be identified by the same reference number without repeating an overlapping description thereof.

According to some example embodiments shown in FIG. 22, each of the first and second electrode structures ST1 and ST2 may include a lower electrode structure LST and an upper electrode structure UST on the lower electrode structure LST. The lower electrode structure LST may include lower electrodes GE1a and GE2a, which are vertically stacked on the substrate 100, and lower insulating layers ILD1, which are interposed between the lower electrodes GE1a and GE2a.

The upper electrode structure UST may include upper electrodes GE1b and GE2b, which are vertically stacked on the uppermost one of the lower electrodes GE1a, and upper insulating layers ILD2, which are interposed between the upper electrodes GE1b and GE2b. The lowermost one of the upper electrodes GE2b may be disposed on the uppermost one of the lower insulating layers ILD1.

Each of the first and second channels VC1a to VC1e and VC2a to VC2e may include a lower channel penetrating the lower electrode structure LST, an upper channel penetrating the upper electrode structure UST, and an expanded portion between the lower and upper channels. The expanded portion may be provided in the uppermost one of the lower insulating layers ILD1. A diameter of each of the first and second channels VC1a to VC1e and VC2a to VC2e may be abruptly increased near the expanded portion.

Figure 23:
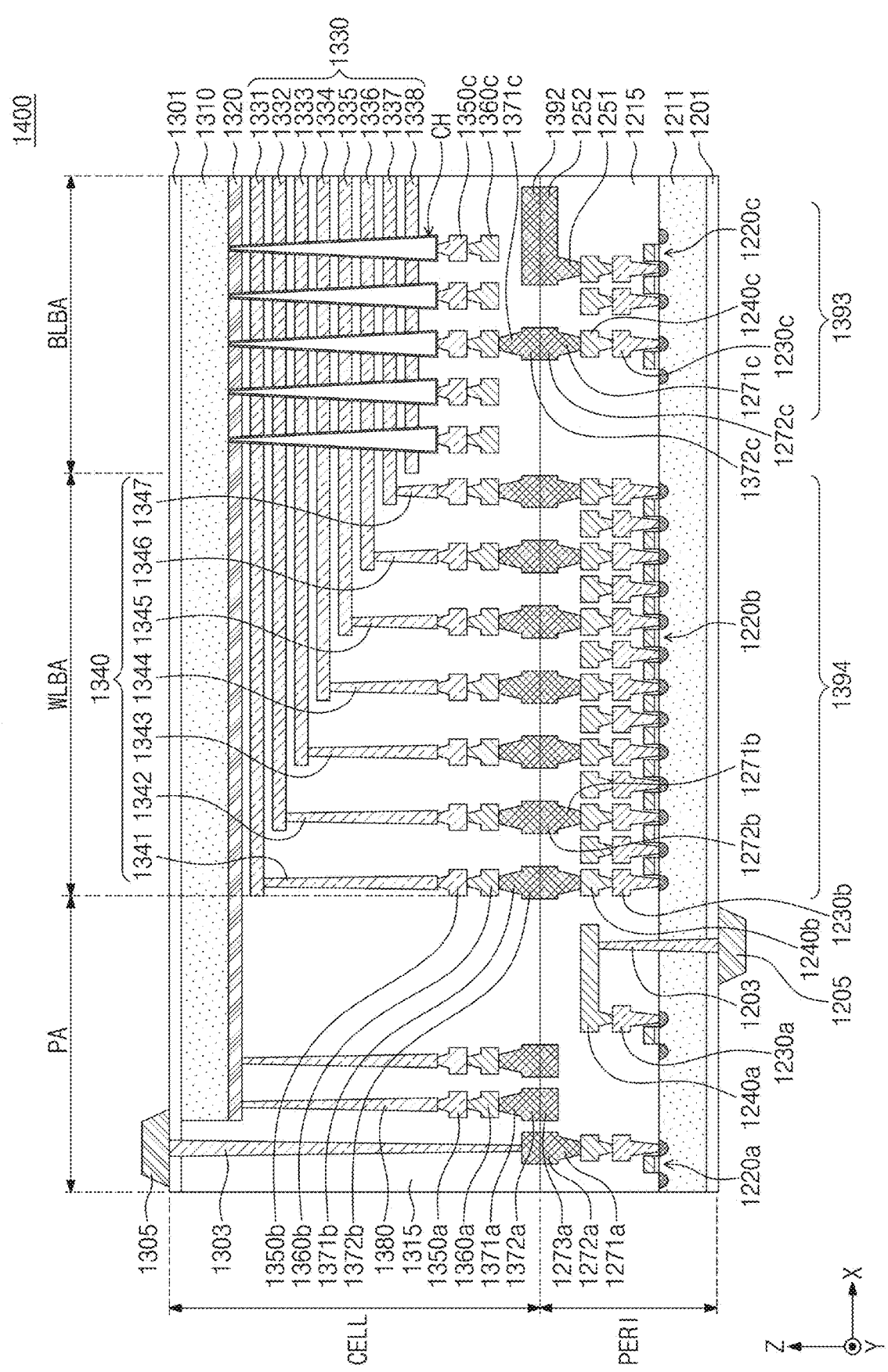

FIG. 23 is a sectional view illustrating a semiconductor device according to some example embodiments of inventive concepts.

Referring to FIG. 23, a memory device 1400 may be provided to have a chip-to-chip (C2C) structure. For the C2C structure, an upper chip including a cell array structure CELL may be fabricated on a first wafer, a lower chip including a peripheral circuit structure PERI may be fabricated on a second wafer different from the first wafer, and the upper chip and the lower chip may be connected to each other in a bonding manner. In the bonding manner, a bonding metal, which is formed in the uppermost metal layer of the upper chip, may be electrically connected to a bonding metal, which is formed in the uppermost metal layer of the lower chip. For example, in the case where the bonding metal is formed of copper (Cu), the bonding manner may be a Cu-to-Cu bonding manner, but in some example embodiments, aluminum (Al) or tungsten (W) may be used as the bonding metal.

Each of the peripheral circuit structure PERI and the cell array structure CELL of the memory device 1400 may include an outer pad bonding region PA, a word line bonding region WLBA, and a bit line bonding region BLBA.

The peripheral circuit structure PERI may include a first substrate 1211, an interlayer insulating layer 1215, a plurality of circuit devices 1220a, 1220b, and 1220c, which are formed in the first substrate 1211, first metal layers 1230a, 1230b, and 1230c, which are respectively connected to the circuit devices 1220a, 1220b, and 1220c, and second metal layers 1240a, 1240b, and 1240c, which are formed on the first metal layers 1230a, 1230b, and 1230c. In some example embodiments, the first metal layers 1230a, 1230b, and 1230c may be formed of or include a material (e.g., tungsten) having relatively high electric resistivity, and the second metal layers 1240a, 1240b, and 1240c may be formed of or include a material (e.g., copper) having relatively low electric resistivity.

FIG. 23 illustrates only the first metal layers 1230a, 1230b, and 1230c and the second metal layers 1240a, 1240b, and 1240c, but in some example embodiments, at least one metal layer may be further formed on the second metal layers 1240a, 1240b, and 1240c. At least one of the additional metal layers, which are formed on the second metal layers 1240a, 1240b, and 1240c, may be formed of a material (e.g., aluminum), which has lower electric resistivity than the material (e.g., copper) of the second metal layers 1240a, 1240b, and 1240c; however, example embodiments are not limited thereto.

The interlayer insulating layer 1215 may be disposed on the first substrate 1211 to cover the circuit devices 1220a, 1220b, and 1220c, the first metal layers 1230a, 1230b, and 1230c, and the second metal layers 1240a, 1240b, and 1240c and may be formed of or include at least one of insulating materials (e.g., silicon oxide and/or silicon nitride).

Lower bonding metals 1271b and 1272b may be formed on the second metal layer 1240b in the word line bonding region WLBA. In the word line bonding region WLBA, the lower bonding metals 1271b and 1272b of the peripheral circuit structure PERI may be electrically connected to upper bonding metals 1371b and 1372b of the cell array structure CELL in a bonding manner, and in some example embodiments, the lower bonding metals 1271b and 1272b and the upper bonding metals 1371b and 1372b may be formed of or include at least one of aluminum, copper, or tungsten.

The cell array structure CELL may include at least one memory block. The cell array structure CELL may include the first cell block and the second cell block in some example embodiments described above. The cell array structure CELL may include a second substrate 1310 and a common source line 1320. A plurality of word lines 1331-1338 (1330) may be stacked on the second substrate 1310 in a direction (e.g., a z-axis direction) that is perpendicular to a top surface of the second substrate 1310. String selection lines and a ground selection line may be respectively disposed on and below the word lines 1330, and the word lines 1330 may be disposed between the string selection lines and the ground selection line.

In the bit line bonding region BLBA, a channel structure CH may be provided to extend in the direction (e.g., the z-axis direction) perpendicular to a top surface of the second substrate 1310 and to penetrate the word lines 1330, the string selection lines, and the ground selection line. The channel structure CH may include a data storage layer, a channel layer, and a buried insulating layer, and in this case, a first metal layer 1350c and a second metal layer 1360c may be electrically connected to the channel layer. For example, the first metal layer 1350c may include the bit line contact plugs, and the second metal layer 1360c may include the bit lines. In some example embodiments, the bit line 1360c may be extended in a first direction (e.g., a y-axis direction) parallel to the top surface of the second substrate 1310.

In some example embodiments shown in FIG. 23, a region, in which the channel structure CH and the bit lines 1360c are provided, may be defined as the bit line bonding region BLBA. In the bit line bonding region BLBA, the bit lines 1360c may be electrically connected to the circuit devices 1220c, which constitute a page buffer 1393 of the peripheral circuit structure PERI. As an example, the bit lines 1360c may be connected to upper bonding metals 1371c and 1372c of the peripheral circuit structure PERI, and the upper bonding metals 1371c and 1372c may be connected to lower bonding metals 1271c and 1272c, which are connected to the circuit devices 1220c of the page buffer 1393.

In the word line bonding region WLBA, the word lines 1330 may be extended in a second direction (e.g., an x-axis direction), which is perpendicular to the first direction and is parallel to the top surface of the second substrate 1310, and may be connected to a plurality of cell contact plugs 1341-1347 (1340). The cell contact plugs 1340 may be connected to pads of the word lines 1330, which extend in the second direction. A first metal layer 1350b and a second metal layer 1360b may be sequentially connected to upper portions of the cell contact plugs 1340 connected to the word lines 1330. In the word line bonding region WLBA, the cell contact plugs 1340 may be connected to the peripheral circuit structure PERI through the upper bonding metals 1371b and 1372b of the cell array structure CELL and the lower bonding metals 1271b and 1272b of the peripheral circuit structure PERI.

In the peripheral circuit structure PERI, the cell contact plugs 1340 may be electrically connected to the circuit devices 1220b constituting or corresponding to a row decoder 1394. In some example embodiments, an operation voltage of the circuit devices 1220b constituting or corresponding to the row decoder 1394 may be different from an operation voltage of the circuit devices 1220c constituting or corresponding to the page buffer 1393. As an example, the operation voltage of the circuit devices 1220c constituting or corresponding to the page buffer 1393 may be higher than the operation voltage of the circuit devices 1220b constituting or corresponding to the row decoder 1394.

A common source line contact plug 1380 may be disposed in the outer pad bonding region PA. The common source line contact plug 1380 may be formed of or include at least one of conductive materials (e.g., at least one of metals, metal compounds, or polysilicon such as doped polysilicon) and may be electrically connected to the common source line 1320. A first metal layer 1350a and a second metal layer 1360a may be sequentially stacked on the common source line contact plug 1380. The outer pad bonding region PA may be or include a region, in which the common source line contact plug 1380, the first metal layer 1350a, and the second metal layer 1360a are provided.

Meanwhile, input/output pads 1205 and 1305 may be disposed in the outer pad bonding region PA. For example referring to FIG. 23, a lower insulating layer 1201 may be formed below the first substrate 1211 to cover the bottom surface of the first substrate 1211, and the first input/output pad 1205 may be formed on the lower insulating layer 1201. The first input/output pad 1205 may be connected to at least one of the circuit devices 1220a, 220b, and 220c of the peripheral circuit structure PERI through a first input/output contact plug 1203 and may be separated apart from the first substrate 1211 by the lower insulating layer 1201. Alternatively or additionally, a sidewall insulating layer (not shown) may be disposed between the first input/output contact plug 1203 and the first substrate 1211 to electrically separate the first input/output contact plug 1203 from the first substrate 1211.

Referring to FIG. 23, an upper insulating layer 1301 may be formed on the second substrate 1310 to cover the top surface of the second substrate 1310, and the second input/output pad 1305 may be disposed on the upper insulating layer 1301. The second input/output pad 1305 may be connected to at least one of the circuit devices 1220a, 1220b, and 1220c of the peripheral circuit structure PERI through a second input/output contact plug 1303. In some example embodiments, the second input/output pad 1305 may be electrically connected to the circuit device 1220a.

In some example embodiments, the second substrate 1310 and the common source line 1320 may be formed to be spaced apart from a region, in which the second input/output contact plug 1303 is provided. Alternatively or additionally, the second input/output pad 1305 may not be overlapped with the word lines 1330 in the third direction (e.g., the z-axis direction). Referring to FIG. 23, the second input/output contact plug 1303 may be spaced apart from the second substrate 1310 in a direction, which is parallel to the top surface of the second substrate 1310, to penetrate an interlayer insulating layer 1315 of the cell array structure CELL and may be connected to the second input/output pad 1305.

In some example embodiments, the first input/output pad 1205 and the second input/output pad 1305 may be provided optionally. As an example, the memory device 1400 may be configured to include only the first input/output pad 1205, which is provided on the first substrate 1211, or to include only the second input/output pad 1305, which is provided on the second substrate 1310. Alternatively, the memory device 1400 may be configured to include both of the first and second input/output pads 1205 and 1305.

A metal pattern, which is used as a dummy pattern, may be provided in the uppermost metal layer of the outer pad bonding region PA and the bit line bonding region BLBA, which are respectively included in the cell array structure CELL and the peripheral circuit structure PERI, or may not be provided in the uppermost metal layer.

The memory device 1400 may include an upper metal pattern 1372a and a lower metal pattern 1273a, which are provided in the outer pad bonding region PA, and here, the lower metal pattern 1273a may be formed in the uppermost metal layer of the peripheral circuit structure PERI to correspond to the upper metal pattern 1372a, which is formed in the uppermost metal layer of the cell array structure CELL, or to have the same shape as the upper metal pattern 1372a of the cell array structure CELL. The lower metal pattern 1273a, which is formed in the uppermost metal layer of the peripheral circuit structure PERI, may not be connected to any contact plug in the peripheral circuit structure PERI. In some example embodiments, the upper metal pattern 1372a may be formed in the uppermost metal layer of the cell array structure CELL and in the outer pad bonding region PA to correspond to the lower metal pattern 1273a, which is formed in the uppermost metal layer of the peripheral circuit structure PERI, or to have the same shape as the lower metal pattern 1273a of the peripheral circuit structure PERI.

The lower bonding metals 1271b and 1272b may be formed on the second metal layer 1240b in the word line bonding region WLBA. In the word line bonding region WLBA, the lower bonding metals 1271b and 1272b of the peripheral circuit structure PERI may be electrically connected to the upper bonding metals 1371b and 1372b of the cell array structure CELL in a bonding manner.

Furthermore, in the bit line bonding region BLBA, an upper metal pattern 1392 may be formed in the uppermost metal layer of the cell array structure CELL to correspond to a lower metal pattern 1252, which is formed in the uppermost metal layer of the peripheral circuit structure PERI or to have the same shape as the lower metal pattern 1252 of the peripheral circuit structure PERI. In some example embodiments, no contact plug may be formed on the upper metal pattern 1392, which is formed in the uppermost metal layer of the cell array structure CELL.

According to some example embodiments of inventive concepts, second channels of a second cell block provided in an edge region of each mat may be arranged in a manner different from first channels of a first cell block provided in a center region of each mat, and accordingly, it may be possible to reduce the amount of and/or significance of and/or impact of and/or probability of a process failure (e.g., a not-open issue of channel holes), which may occur in a process of forming the second channels of the second cell block. Accordingly, it may be possible to prevent or reduce the impact of and/or amount of and/or probability of memory cells including the second channels from failing in the edge region of each mat and thereby to improve the reliability of the semiconductor device.

Example embodiments are not limited to those described above. For example, none of the example embodiments are to be construed as necessarily mutually exclusive. For example some example embodiments may include one or more features described with reference to one or more figures, and may also include one or more other features described with reference to one or more other figures.

Any of the elements disclosed above may include and/or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While some example embodiments of inventive concepts have been particularly shown and described, it will be understood by one of ordinary skill in the art that variations in form and detail may be made therein without departing from the spirit and scope of the attached claims.

What is claimed is:
1. A semiconductor device, comprising:
a substrate;
a first cell block including a first electrode structure and first channels penetrating the first electrode structure, the first electrode structure including first electrodes stacked on the substrate; and
a second cell block including a second electrode structure and second channels penetrating the second electrode structure, the second electrode structure including second electrodes stacked on the substrate,
wherein the first and second electrode structures extend in a first direction,
the first electrode structure has a first width in a second direction crossing the first direction, the second electrode structure has a second width greater than the first width, a side surface of the first electrode structure and one first channel, among the first channels, adjacent to the side surface of the first electrode structure are spaced apart from each other by a first distance, and a side surface of the second electrode structure and the second channel adjacent to the second electrode structure are apart from each other by a second distance that is different from the first distance.

2. The semiconductor device of claim 1, wherein the one first channel, among the first channels, adjacent to the side surface of the first electrode structure has a first channel width, and the one second channel, among the second channels, adjacent to the side surface of the second electrode structure has a second channel width greater than the first channel width.

3. The semiconductor device of claim 1, wherein the first channels correspond to a plurality of first columns spaced apart from each other in the second direction, the first columns comprise a first edge column closest to the side surface of the first electrode structure, and a first intermediate column next closest to the side surface of the first electrode structure, the second channels correspond to a plurality of second columns spaced apart from each other in the second direction, the second columns comprise a second edge column closest to the side surface of the second electrode structure, and a second intermediate column next closest to the side surface of the second electrode structure, and a distance between the second edge column and the second intermediate column is greater than a distance between the first edge column and the first intermediate column.

4. The semiconductor device of claim 3, wherein, in each of the first columns the first channels are spaced apart from each other in the first direction by a first distance, in each of the second columns the second channels are spaced apart from each other in the first direction by a second distance, and the first distance is substantially equal to the second distance.

5. The semiconductor device of claim 3, wherein a number of the first columns is equal to a number of the second columns.

6. The semiconductor device of claim 1, wherein the first channels correspond to a plurality of first columns spaced apart from each other in the second direction, the first columns comprise a first edge column adjacent to the side surface of the first electrode structure, and a first center column farthest from the side surface of the first electrode structure, the second channels correspond to a plurality of second columns spaced apart from each other in the second direction, the second columns comprise a second edge column adjacent to the side surface of the second electrode structure, and a second center column farthest from the side surface of the second electrode structure, distances between adjacent ones of the first columns decrease in a direction from the first edge column toward the first center column, and distances between adjacent ones of the second columns decrease in a direction from the second edge column toward the second center column.

7. The semiconductor device of claim 1, wherein the first channels correspond to a plurality of first columns spaced apart from each other in the second direction, the first columns comprise a first edge column adjacent to the side surface of the first electrode structure, and a first center column farthest from the side surface of the first electrode structure, the second channels correspond to a plurality of second columns spaced apart from each other in the second direction, the second columns comprise a second edge column adjacent to the side surface of the second electrode structure, and a second center column farthest from the side surface of the second electrode structure, widths of the first channels in the second direction decrease in a direction from the first edge column toward the first center column, and widths of the second channels in the second direction decrease in a direction from the second edge column toward the second center column.

8. The semiconductor device of claim 7, wherein the first channels have substantially the same width in the first direction, and the second channels have substantially the same width in the first direction.

9. The semiconductor device of claim 1, wherein the first channels correspond to a plurality of first columns spaced apart from each other in the second direction, the second channels correspond to a plurality of second columns spaced apart from each other in the second direction, and a number of the first columns is greater than a number of the second columns.

10. The semiconductor device of claim 1, further comprising:

first contact plugs coupled to the first channels;

second contact plugs coupled to the second channels; and a bit line extending in the second direction to cross the first and second electrode structures, wherein the bit line connects to at least one of the first contact plugs and at least one of the second contact plugs.

11. The semiconductor device of claim 1, further comprising:

a dummy block including a dummy electrode structure and dummy channels penetrating the dummy electrode structure, the dummy electrode structure including dummy electrodes stacked on the substrate extending in the first direction, wherein the dummy electrode structure has a third width in the second direction, the third width substantially equal to the first width, and the second cell block is between the dummy block and the first cell block.

12. The semiconductor device of claim 11, wherein a side surface of the dummy electrode structure and one dummy channel, among the dummy channels, adjacent to the side surface of the dummy electrode structure are spaced apart from each other by a third distance that is substantially equal to the first distance.

13. A semiconductor device, comprising:

a first cell block including a first electrode structure and first channels penetrating the first electrode structure, the first electrode structure including first electrodes stacked on a substrate; and a second cell block including a second electrode structure and second channels penetrating the second electrode structure, the second electrode structure including second electrodes stacked on the substrate, wherein the first and second electrode structures extend in a first direction, the first channels correspond to a plurality of first columns spaced apart from each other in a second direction crossing the first direction, the first columns comprise a first edge column closest to a side surface of the first electrode structure, and a first intermediate column next closest to the side surface of the first electrode structure, the second channels correspond to a plurality of second columns spaced apart from each other in the second direction, the second columns comprise a second edge column closest to a side surface of the second electrode structure, and a second intermediate column next closest to the side surface of the second electrode structure, a distance between the second edge column and the second intermediate column is different from a distance between the first edge column and the first intermediate column, and a width of each of the first channels in the first edge column is different from a width of each of the second channels in the second edge column.

14. The semiconductor device of claim 13, wherein the first electrode structure has a first width in the second direction, and the second electrode structure has a second width greater than the first width in the second direction.

15. The semiconductor device of claim 13, wherein a distance between the side surface of the first electrode structure and the first edge column is different from a distance between the side surface of the second electrode structure and the second edge column.

16. The semiconductor device of claim 13, wherein the first columns further comprise a first center column farthest from the side surface of the first electrode structure, distances between the first columns decrease in a direction from the first edge column toward the first center column, the second columns further comprise a second center column farthest from the side surface of the second electrode structure, and distances between the second columns decrease in a direction from the second edge column to the second center column.

17. The semiconductor device of claim 13, wherein the first columns further comprise a first center column farthest from the side surface of the first electrode structure, widths of the first channels in the second direction decrease in a direction from the first edge column toward the first center column, the second columns further comprise a second center column farthest from the side surface of the second electrode structure, and widths of the second channels in the second direction decrease in a direction from the second edge column toward the second center column.

18. The semiconductor device of claim 17, wherein, in each of the plurality of first columns, the first channels are spaced apart from each other in the first direction by a constant distance.

19. The semiconductor device of claim 13, wherein the first channels have substantially the same width in the first direction, and the second channels have substantially the same width in the first direction.

20. An electronic system, comprising:

a semiconductor device including a first cell block, a second cell block, a peripheral circuit connected to the first and second cell blocks, and an input/output pad electrically connected to the peripheral circuit, the first cell block comprising a first electrode structure and first channels penetrating the first electrode structure, the first electrode structure including first electrodes stacked on a substrate, the second cell block comprising a second electrode structure and second channels penetrating the second electrode structure, the second electrode structure including second electrodes stacked on the substrate; and a controller electrically connected to the semiconductor device through the input/output pad and configured to control the semiconductor device, wherein the first and second electrode structures extend in a first direction, in a second direction crossing the first direction, the first electrode structure has a first width and the second electrode structure has a second width greater than the first width, and the second channels of the second cell block differ from the first channels in at least one of a channel width or a distance to another adjacent channel.

* * * * *